(12) United States Patent
Lien et al.

(10) Patent No.: US 11,355,208 B2
(45) Date of Patent: Jun. 7, 2022

(54) TRIGGERING NEXT STATE VERIFY IN PROGAM LOOP FOR NONVOLATILE MEMORY

(71) Applicant: SanDisk Technologies LLC, Addison, TX (US)

(72) Inventors: Yu-Chung Lien, San Jose, CA (US); Fanglin Zhang, Fremont, CA (US); Zhuojie Li, Santa Clara, CA (US); Huai-Yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/916,790

(22) Filed: Jun. 30, 2020

(65) Prior Publication Data
US 2021/0407605 A1    Dec. 30, 2021

(51) Int. Cl.
| | | |
|---|---|---|
| *G11C 16/06* | (2006.01) |
| *G11C 16/34* | (2006.01) |
| *G11C 16/04* | (2006.01) |
| *G11C 16/10* | (2006.01) |
| *H01L 27/11582* | (2017.01) |
| *G11C 16/26* | (2006.01) |
| *H01L 27/11565* | (2017.01) |
| *G11C 11/56* | (2006.01) |

(52) U.S. Cl.
CPC ...... *G11C 16/3459* (2013.01); *G11C 16/0483* (2013.01); *G11C 16/10* (2013.01); *G11C 11/5671* (2013.01); *G11C 16/26* (2013.01); *H01L 27/11565* (2013.01); *H01L 27/11582* (2013.01)

(58) Field of Classification Search
CPC ..... G11C 16/3459; G11C 16/10; G11C 16/26; G11C 16/0483; G11C 11/5671; H01L 27/11565; H01L 27/11582
See application file for complete search history.

(56) References Cited

U.S. PATENT DOCUMENTS

| | | | | |
|---|---|---|---|---|
| 2015/0348633 A1* | 12/2015 | Song | ............... | G11C 11/5642 365/185.19 |
| 2017/0046210 A1* | 2/2017 | Yim | ............... | G11C 16/10 |
| 2020/0051649 A1* | 2/2020 | Her | ............... | G11C 16/30 |

\* cited by examiner

*Primary Examiner* — Uyen Smet
(74) *Attorney, Agent, or Firm* — Dickinson Wright PLLC; Steven Hurles

(57) ABSTRACT

Apparatus and methods are described to program memory cells and verify stored values programmed into the cells. The next stage in stored memory can be moved to the current verification iteration when certain conditions are met. Verification can include counting bits that exceed a voltage value for a stage being verified to produce a bit count number and determining if the bit count number for the stage being verified meets a threshold value. If the bit count number does not meet the threshold, the verification process can continue with a current verify iteration and thereafter move to a next verify iteration. If the bit count number does meet the threshold, the process can add a next stage to the current verify iteration and thereafter move to a next verify iteration.

20 Claims, 14 Drawing Sheets

TRIGGERING NEXT STATE VERIFY IN PROGAM LOOP FOR NONVOLATILE MEMORY

BACKGROUND

The present technology relates to the operation of memory devices. Semiconductor memory devices have become more popular for use in various electronic devices. For example, non-volatile semiconductor memory is used in cellular telephones, digital cameras, personal digital assistants, mobile computing devices, non-mobile computing devices and other devices. Memory devices always strive for improved efficiency and speed of operation.

SUMMARY

Various embodiments are described herein for operating a nonvolatile memory, e.g., a NAND, a BICS memory or the like. A memory can include a memory control circuitry and a plurality of memory cells to store data. The memory control circuitry is configured to: program data into the plurality of memory cells; verify stored values programmed into the cells. The verification includes counting bits that exceed a voltage value for a stage being verified to produce a bit count number and determining if the bit count number for the stage being verified meets a threshold value. If the bit count number does not meet the threshold value, the current verify iteration is continued and, and thereafter, the verification process proceeds to the next verify iteration. If the bit count number does meet the threshold, then a next stage is added to the current verify iteration, and thereafter, the verification process proceeds to the next verify iteration.

In an example embodiment, the states of the memory include eight states with sequentially increasing programming voltages.

In an example embodiment, the voltage values of the stages sequentially increase for successive stages.

In an example embodiment, the memory controller is configured to count a high voltage side of the verify pulse for counting memory cells that exceed the stage voltage value.

In an exemplary embodiment, the memory controller is configured to issue a first program pulse followed by an A-stage verify and a B-stage verify, perform the bit count in the B-stage verify, and output a C-stage verify signal during the same iteration as both the A-stage verify and the B-stage verify when the bit count exceeds the threshold, and wherein the memory controller is configured to issue a second program pulse that is greater than the first program pulse and perform a B-stage verify and a C-stage verify.

In an example embodiment, the memory controller is configured to conduct a bit count of the C-stage and output a D-stage verify signal during the same iteration as both the B-stage verify and the C-stage verify when the C-stage bit count exceeds the threshold, and wherein the memory controller is configured to issue a third program pulse that is greater than the second program pulse and issue instructions for a C-stage verify and a D-stage verify.

In an example embodiment, the memory controller is configured to conduct a bit count of the D-stage and output an E-stage verify signal during the same iteration as both the C-stage verify and the D-stage verify when the D-stage bit count exceeds the threshold, and wherein the memory controller is configured to issue a fourth program pulse that is greater than the third program pulse and issue instructions for a D-stage verify and an E-stage verify.

In an example embodiment, the memory controller is configured to not add an F-stage verify or a G-stage verify to a preceding iteration.

In an example embodiment, the memory controller is configured to perform QPW before either the R clock or the RWL clock with the bit count occurring during the RWL clock.

In an example embodiment, the memory cells are multiple level memory cells storing greater than one bit in binary.

Another aspect of the present disclosure is related to a nonvolatile memory control method which includes programming memory cells. The method proceeds with verifying stored values programmed into the cells. The verification includes counting bits that exceed a voltage value for a stage being verified to produce a bit count number and determining if the bit count number for the stage being verified meets a threshold value. If the bit count number does not meet the threshold value, the current verify iteration is continued and, and thereafter, the verification process proceeds to the next verify iteration. If the bit count number does meet the threshold, then a next stage is added to the current verify iteration, and thereafter, the verification process proceeds to the next verify iteration.

In an example embodiment, the verification operation includes conducting the next stage verify after a subsequent programming pulse that has an increased voltage from a preceding programming pulse.

In an example embodiment, the step of counting bits includes conducting a bit scan during RWL phase of the verifying step.

In an example embodiment, conducting a bit scan during the RWL phase includes performing the RWL phase after the IQPW phase.

In an example embodiment, adding a next stage to the current verify operation and thereafter moving to a next verify iteration includes increasing the verify signal to the next stage value directly from the preceding verify level and not applying a programming pulse or dropping the verify voltage to about zero volts.

In an example embodiment, programming the memory cells includes programming seven stages (A-G) and verifying includes only adding a next stage when the next stage is the C-stage, the D-stage or the E-stage.

In an example embodiment, verifying includes issuing a first program pulse followed by an A-stage verify signal and a B-stage verify signal, performing the bit count in a B-stage verify, and outputting a C-stage verify signal during the same iteration as both an A-stage verify and a B-stage verify when the bit count of the B-stage exceeds the threshold, and moving to a subsequent iteration when the bit count of the B-stage does not meet the threshold during which issuing a second program pulse, greater than the first program pulse and performing a B-stage verify.

In an example embodiment, a circuit for operating a plurality of memory dies is provided. The circuit includes a bus which is configured to connect with a plurality of nonvolatile memory cells. The circuit is further configured to, via the bus, program the nonvolatile memory cells and verify stored bits programmed into the memory cells with variable verify steps values in the same verify iteration. The verification process including counting stored bits that exceed a voltage value for a stage being verified to produce a bit count number. The circuit then determines if the bit count number for the stage being verified meets a threshold value. If the bit count number does not meet the threshold voltage, then the circuit is configured to continue with a current verify iteration and thereafter move to a next verify iteration. If the bit count number does meet the threshold, then the circuit adds a next stage to the current verify iteration and thereafter move to a next verify iteration.

In an exemplary embodiment, the states of the memory include eight states with sequentially increasing programming voltages.

In an example embodiment, the voltage values of the stages sequentially increase for successive stages.

BRIEF DESCRIPTION OF THE DRAWINGS

A more particular description is included below with reference to specific embodiments illustrated in the appended drawings. Understanding that these drawings depict only certain embodiments of the disclosure and are not, therefore, to be considered limiting of its scope, the disclosure is described and explained with additional specificity and detail through the use of the accompanying drawings, in which.

DETAILED DESCRIPTION

Figure 1:
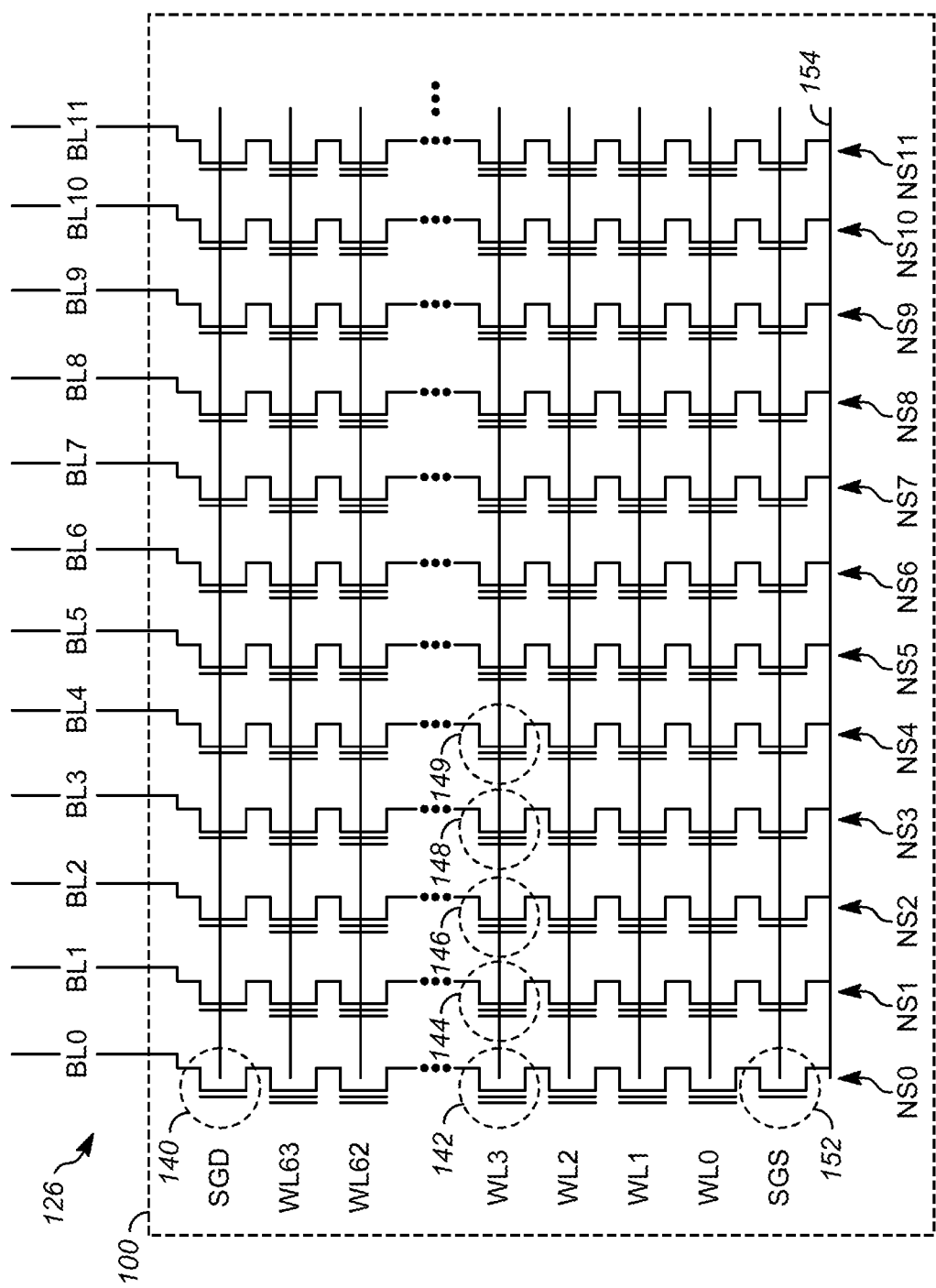
FIG. 1 illustrates an embodiment of an array of memory cells including bit and word lines according to an example embodiment.

Systems and methods are described for controlling the program operations of nonvolatile memory to improve speed of operation by counting the number of memory cells that verify for a particular state and then trigger the next state verify. This can be done without performing another program signal or a voltage level ramp down. In an example embodiment, the system or method of the present disclosure can trigger the next state verify within the same program loop. This can be triggered when the count of the upper tail bits is larger than a threshold value that can be stored on die. In an example embodiment, the memory may not enact the voltage level ramp down with the upper tail bit counts above the threshold value. The memory will enact the voltage level ramp down (e.g., during the RR phase of program verify) after the program verify for a state with the bits in the upper tail being below the threshold value.

A programming operation for a group of memory cells typically involves providing the memory cells in an erased state and then applying a series of program pulses to the memory cells. Each program pulse is provided in a program loop, also referred to as a program-verify iteration. For example, the program pulse may be applied to a word line that is connected to control gates of the memory cells. In one approach, incremental step pulse programming is performed, in which the program pulse amplitude is increased by a step size in each program loop. Verify operations may be performed after each program pulse to determine whether the memory cells have completed programming. When programming has completed for a memory cell, the memory cell can be locked out from further programming while programming continues for other memory cells in subsequent program loops.

Each memory cell may be associated with a memory state according to write data in a program command. As used herein, a "memory state" is a detectable characteristic of a memory cell (e.g., a threshold voltage of a NAND memory cell, a resistance of a ReRAM memory cell, a magnetization state of a magnetoresistive random access memory) that may be used to represent a data value, such as a binary data value, including more than one binary bit. As used herein, the detectable characteristic of a memory cell used to represent a data value is referred to as a "programming characteristic." Based on write data in a program command, a memory cell will either remain in the erased state or be programmed to a memory state (a programmed memory state) different from the erased state.

For example, in a two-bit per cell memory device, there are four memory states including the erased state and three programmed memory states. In a three-bit per cell memory device, there are eight memory states including the erased state and seven programmed memory states. In a four-bit per cell memory device, there are sixteen memory states including the erased state and fifteen programmed memory states.

When a program command is issued, the write data are stored in data latches associated with the memory cells. For example, in a two-bit per cell memory device, each memory cell is associated with two data latches (e.g., DL1, DL2) that store the two-bit write data for the memory cell. Likewise, in a three-bit per cell memory device, each memory cell is associated with three data latches (e.g., DL1, DL2, DL3) that store the three-bit write data for the memory cell. Similarly, in a four-bit per cell memory device, each memory cell is associated with four data latches (e.g., DL1, DL2, DL3, DL4) that store the four-bit write data for the memory cell. Examples of data latches can be found in U.S. Pat. No. 10,535,401, which is incorporated by reference herein.

During programming, the data latches of a memory cell can be read to determine the memory state to which the cell is to be programmed. For NAND memory cells, each programmed memory state is associated with a verify voltage. A NAND memory cell with a given memory state is considered to have completed programming when a sensing operation determines the threshold voltage (Vth) of the memory cell is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

In addition to the verify operations described above, a bitscan operation also may be performed to determine when programming is complete for a group of memory cells. As used herein, a "bitscan" is an operation that counts a number of memory cells whose programming characteristic has not shifted above a particular verify voltage level for a particular memory state. For NAND memory cells, a bitscan is an operation that counts a number of memory cells whose threshold voltage has not shifted above a particular verify voltage level for a particular memory state. For example, a state N bitscan is a count of a number of state N memory cells whose threshold voltage has not shifted above a verify voltage level for state N. Likewise, a state (N+1) bitscan is a count of a number of state (N+1) memory cells whose threshold voltage has not shifted above a verify voltage level for state (N+1), and so on. For simplicity, the following discussion will refer to bitscan operations for NAND memory cells. Persons of ordinary skill in the art will understand that bitscan operations also may be used for other non-volatile memory technologies. According to embodiments of the present disclosure these bitscan counts to trigger the verify operation to skip to the next program level in the same programming loop.

Programming of memory cells for a particular memory state may be considered complete if the bitscan count for a particular state is less than a predetermined value. In some embodiments, the predetermined value is less than a number of read errors that can be corrected by an error correction code engine. In other words, programming of memory cells for a particular memory state may be considered complete even though all memory cells that are to be programmed to the particular memory state do not have threshold voltages that have shifted above a verify voltage level for the memory state, as long as the number of "failing" memory cells is less than a number of read errors that can be corrected by an error correction code engine. Moreover, the count of the bitscan can be used to trigger a skip to the next memory state verify operation.

Bitscan calculations typically are performed based on results of verify operations for a particular program-verify iteration. In particular, following application of a program pulse, verify operations may be performed for one or more memory states, and then results of the verify operations may be used to calculate the bitscan for a particular memory state.

In some programming techniques, following each program pulse, a bitscan is performed for a single memory state (a "single-state bitscan"), and bitscans for higher memory states are not performed until the bitscan count for the lower memory state is less than the threshold value. Under some circumstances, performing such single-state bitscans may result in extra verify operations being performed and extra program pulses being applied to the memory cells, even though the memory cells have actually completed programming. This is undesirable because time is consumed performing verify operations, and applying unnecessary program pulses may cause over program.

In other programming techniques, following each programming pulse, a bitscan is performed for multiple (e.g., n) consecutive memory states (an "n-state bitscan"). Under some circumstances, performing such n-state bitscans also may result in extra verify operations being performed and extra program pulses being applied to the memory cells, even though the memory cells have actually completed programming. As in the case of single-state bitscans, this is undesirable because time is consumed performing verify operations, and applying unnecessary program pulses may cause over program. Technology is described herein which can perform an n-state bitscan to perform program verify for more than one memory state in a single iteration, e.g., when the bit count for a lower state exceeds a threshold value.

FIG. 1 depicts an embodiment of memory arranged as NAND flash memory cells in a memory array 126. As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM). Non-volatile memory can be BiCS memory architecture. Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell, such as a single-level cell (SLC). However, in some cases more than one data bit per memory cell (e.g., a multi-level cell) can be provided by programming and reading multiple threshold voltages or threshold voltage ranges, including a multi-level cell (MLC) (2 bits-per-cell), a triple level cell (TLC) (3 bits-per-cell), a quad-level cell (QLC) (4 bits-per-cell), and so forth.

The memory array 126 can include many blocks of memory. A "block of memory" is a set of memory cells. For example, a block of memory (e.g., an array of memory cells) includes memory cells arranged in word lines and bit lines. A "sub-block" of memory is a subset of a block of memory. For instance, a sub-block is a subset of memory cells corresponding to a subset of the word lines of a block of memory. In an embodiment, a sub-block includes fifty word lines in a block of memory, where the block of memory includes more than fifty word lines. A sub block can denote a physical sub-block, a logical sub-block, or both. A block of memory includes two or more sub-blocks. In an embodiment, memory is structured as two-dimensional (2D) NAND. In another embodiment, memory is structured as three-dimensional (3D) NAND. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

An illustrative block of memory (or block) 100, as shown in FIG. 1, includes a number of NAND strings NS0 to NS11 and respective bit lines (e.g., BL0 to BL11, which are shared among the blocks). Each NAND string is connected at one end to a drain select gate (SGD), and the control gates of the drain select gates are connected via a common SGD line. Each NAND string is connected at its other end to a source select gate (SGS) which, in turn, is connected to a common source line 154. For example, NS0 includes a source side select gate transistor 152 and a drain side select gate transistor 140. Example storage elements 142, 144, 146, 148, and 149 are in NS0 to NS4, respectively, and are connected to a word line WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

Other types of non-volatile memory in addition to NAND flash memory can also be used. For example, another type of memory cell useful in flash EEPROM systems utilizes a nonconductive dielectric material in place of a conductive floating gate to store charge in a nonvolatile manner. In an embodiment, triple layer dielectric formed of silicon oxide, silicon nitride, and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than threshold voltage levels can be stored and sensed.

Figure 2:
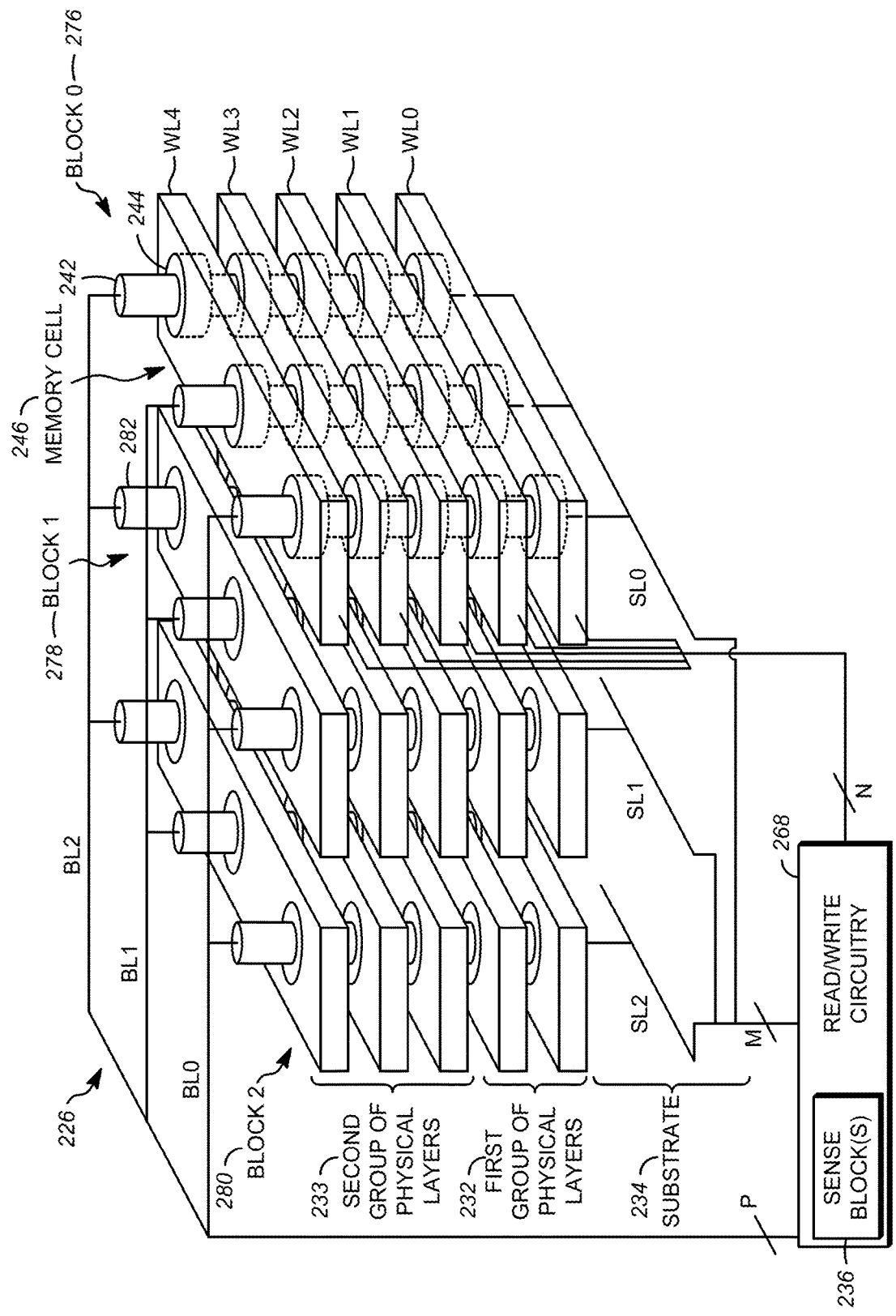
FIG. 2 illustrates a diagram of a three-dimensional (3D) memory in a NAND configuration according to an example embodiment.

FIG. 2 illustrates an embodiment of 3D memory 226 in a NAND flash configuration. The 3D memory 226 includes multiple physical layers that are monolithically formed above a substrate 234, such as a silicon substrate. Storage elements (e.g., memory cells), such as a representative memory cell 246, are arranged in arrays in the physical layers.

The representative memory cell 246 includes a charge trap structure 244 between a word line/control gate WL4 and a conductive channel 242. Charge can be injected into or drained from the charge trap structure 244 via biasing of the conductive channel 242 relative to the word line WL4. For example, the charge trap structure 244 can include silicon nitride and can be separated from the word line WL4 and the conductive channel 242 by a gate dielectric, such as a silicon oxide. An amount of charge in the charge trap structure 244 affects an amount of current through the conductive channel 242 during a read operation of the memory cell 246 and indicates one or more bit values that are stored in the memory cell 246.

The 3D memory 226 includes multiple erase blocks, including a first block (block 0) 276, a second block (block 1) 278, and a third block (block 2) 280. Each block 276, 278, 280 includes a "vertical slice" of the physical layers that includes a stack of word lines, illustrated as a first word line WL0, a second word line WL1, a third word line WL2, a fourth word line WL3, and a fifth word line WL4. Multiple conductive channels (having a substantially vertical orientation, as shown in FIG. 2) extend through the stack of word lines. Each conductive channel is coupled to a storage element in each word line WL0-WL4, forming a NAND string of storage elements. FIG. 2 illustrates three blocks 276, 278, 280, five word lines WL0-WL4 in each block 276, 278, 280, and three conductive channels in each block 276, 278, 280 for clarity of illustration. However, the 3D memory 226 can have more than three blocks, more than five word lines per block, and more than three conductive channels per block.

Read/write circuitry 268 (which can be part of a controller) is coupled to the conductive channels via multiple conductive lines, illustrated as a first bit line BL0, a second bit line BL1, and a third bit line BL2 at a first end of the conductive channels (e.g., an end most remote from the substrate 234) and a first source line SL0, a second source line SL1, and a third source line SL2 at a second end of the conductive channels (e.g., an end nearer to or within the substrate 234). The read/write circuitry 268 is illustrated as coupled to the bit lines BL0-BL2 via "P" control lines, coupled to the source lines SL0-SL2 via "M" control lines, and coupled to the word lines WL0-WL4 via "N" control lines. Each of P, M, and N can have a positive integer value based on the specific configuration of the 3D memory 226. In the example shown in FIG. 2, P=3, M=3, and N=5.

In a particular embodiment, each of the bit lines BL0-BL2 and each of the source lines SL0-SL2 can be coupled to the same end (e.g., the first end or the second end) of different conductive channels. For example, a particular bit line BL0-BL2 can be coupled to a first end of a conductive channel 282 and a particular source line can be coupled to a first end of the conductive channel 242. A second end of the conductive channel 282 can be coupled (e.g., electrically coupled) to a second end of the conductive channel 242. Accordingly, the conductive channel 282 and the conductive channel 242 can be coupled in series and can be coupled to the particular bit line BL0-BL2 and the particular source line SL0-SL2, each of which is coupled to a particular NAND string.

Although each of the conductive channels, such as the conductive channels 242, 282, is illustrated as a single conductive channel, each of the conductive channels can include multiple conductive channels that are in a stack configuration. The multiple conductive channels in a stacked configuration can be coupled by one or more connectors. Additionally, an etch stop layer (not illustrated in FIG. 2) having a conductive connector coupled to physically proximate portions of a conductive channel can be included in the multiple conductive channels, such as between the first group of physical layers 232 and the second group of physical layers 233. Additionally, or alternatively, one or more sub-block gate transistors (not illustrated in FIG. 2) can be coupled between the first group of physical layers 232 and the second group of physical layers 233.

In an embodiment, the first group of physical layers 232 is an example of a first sub-block and the second group of physical layers 233 is an example of a second sub-block. For example, each sub-block (e.g., "word line-based" sub-blocks) can include memory cells corresponding to a subset of word lines WL0-WL4. In an alternative embodiment, each sub-block (e.g., "string-based" sub-blocks) can include memory cells corresponding to a subset of strings (e.g., NAND strings), and can have, for example, common source lines SL0-SL2, but not common bit lines BL0-BL2 or vice versa.

The read/write circuitry 268 facilitates and/or effectuates read and write operations performed on the 3D memory 226. For example, data can be stored to storage elements coupled to a word line WL0-WL4 and the read/write circuitry 268 can read bit values from the storage elements (e.g., memory cells) using one or more sense blocks 236. As another example, the read/write circuitry 268 can apply selection signals to control lines coupled to the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4). The read/write circuitry 226 can also perform verify operations as part of the programming operation.

The read/write circuitry 268 includes one or more sense blocks 236. The sense blocks 236 are utilized to read or sense one or more values stored in a memory cell. In one approach, one sense block 236 is provided for a group of NAND strings, each of which is coupled to a particular bit line BL0-BL2. For example, a sense block 236 is associated with BL0. Another sense block 236 is associated with BL1, and yet another sense block 236 is associated with BL2. Each sense block 236 can include a memory controller (not illustrated in FIG. 2). Each sense block 236 also includes a sense module for each NAND string. Alternatively, a sense block 236 can be coupled to an interval of bit lines, such as even or odd numbered bit lines.

During a read operation, a controller can receive a request from a host device, such as a computer, smartphone, or laptop computer. The controller can cause the read/write circuitry 268 to read bits from particular storage elements of the 3D memory 226 by applying appropriate signals to the control lines to cause storage elements of a selected word line to be sensed. Accordingly, the 3D memory 226 having multiple conductive channels in a stacked configuration can be configured to read from and write data to one or more storage elements.

One or more subblocks of memory cells 246 in an array of memory cells 246 can be coupled by a channel (e.g., a physical communication channel). In an embodiment, the channel comprises a bit line BL0-BL2 and/or a source line SL0-SL2.

Figure 3:
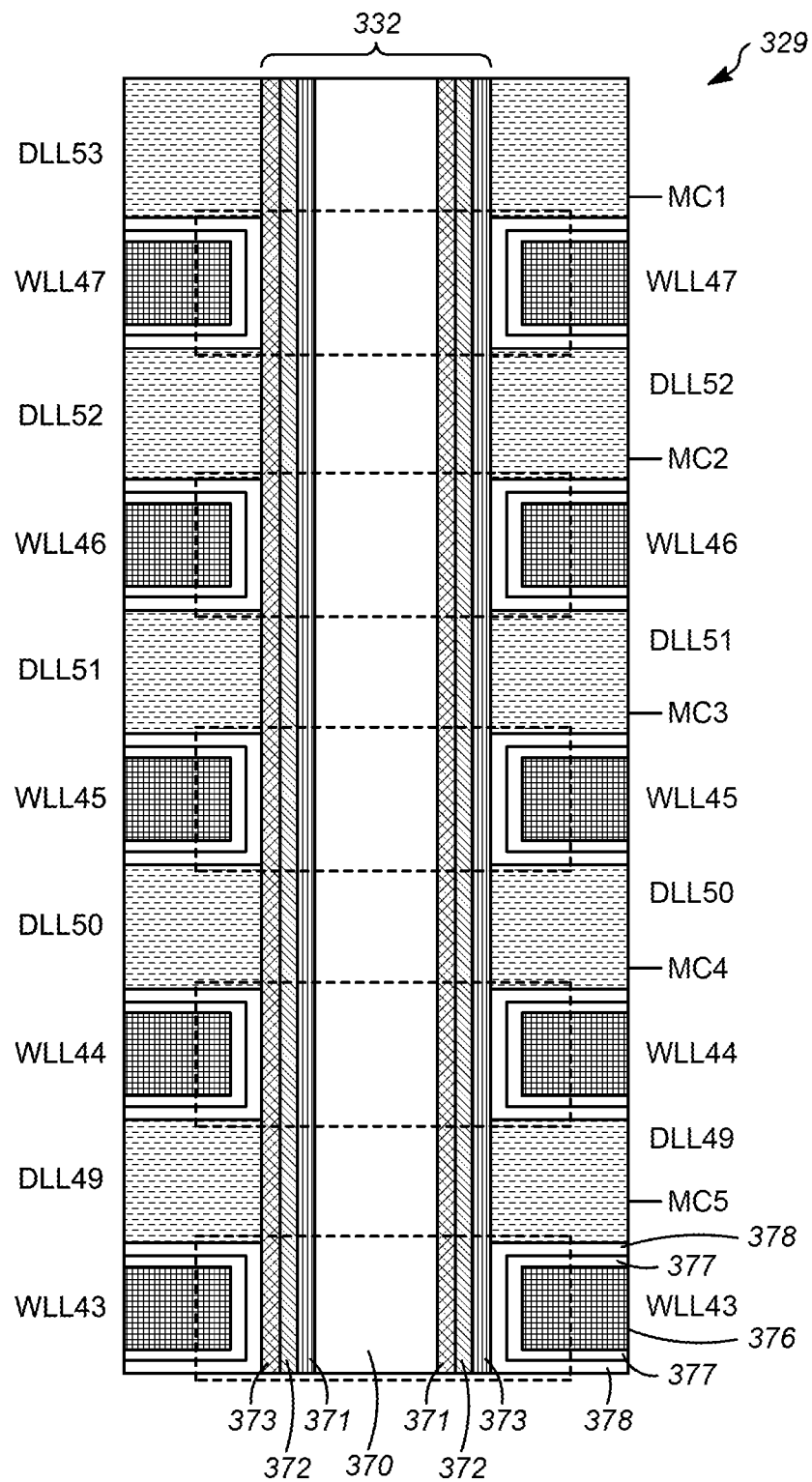
FIG. 3 illustrates a schematic block diagram illustrating an embodiment of a 3D vertical memory structure according to an example embodiment.

FIG. 3 illustrates one embodiment of a cross-sectional view of a 3D, vertical memory structure or string 329. In one embodiment, the vertical column 332 is round and includes four layers; however, in other embodiments more or less than four layers can be included, and other shapes can be used (e.g., a "U" shape instead of an "I" shape or the like). In one embodiment, a vertical column 332 includes an inner core layer 370 that is made of a dielectric, such as SiO2. Other materials can also be used. Surrounding the inner core or inner core layer 370 is a polysilicon channel 371. Materials other than polysilicon can also be used. Note that it is the channel 371 that connects to the bit line. Surrounding the channel 371 is a tunneling dielectric 372. In one embodiment, the tunneling dielectric 372 has an ONO structure. Surrounding the tunneling dielectric 372 is a shared charge-trapping layer 373, such as (for example) Silicon Nitride. Other materials and structures can also be used. The technology described herein is not limited to any particular material or structure.

FIG. 3 depicts dielectric layers DLL49, DLL50, DLL51, DLL52, and DLL53, as well as word line layers WLL43, WLL44, WLL45, WLL46, and WLL47. Each of the word line layers includes a word line region 376 surrounded by an aluminum oxide layer 377, which is surrounded by a blocking oxide (SiO2) layer 378. The physical interaction of the word line layers with the vertical column 332 forms the memory cells. Thus, a memory cell, in one embodiment, comprises the channel 371, tunneling dielectric 372, charge-trapping layer 373 (e.g., shared with other memory cells), blocking oxide layer 378, aluminum oxide layer 377, and the word line region 376. In some embodiments, the blocking oxide layer 378 and aluminum oxide layer 377 can be replaced by a single layer of material with insulating properties or by more than two layers of different material with insulating properties. Furthermore, the materials used are not limited to silicon dioxide (SiO2) or aluminum oxide. For example, word line layer WLL47 and a portion of vertical column 332 comprise a memory cell MC1. Word line layer WLL46 and a portion of vertical column 332 comprise a memory cell MC2. Word line layer WLL45 and a portion of vertical column 332 comprise a memory cell MC3. Word line layer WLL44 and a portion of vertical column 332 comprise a memory cell MC4. Word line layer WLL43 and a portion of vertical column 332 comprise a memory cell MC5. In other architectures, a memory cell can have a different structure, however, the memory cell would still be the storage unit.

When a memory cell is programmed, electrons are stored in a portion of the charge-trapping layer 373 that is associated with the memory cell. These electrons are drawn into the charge-trapping layer 373 from the channel 371, through the tunneling dielectric 372, in response to an appropriate voltage on the word line region 376. The threshold voltage (Vt) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 329 (e.g., different memory strings 329) on different bit lines, in certain embodiments, can be on the same word line. Each word line can store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D memory structure 329 comprises an "I" shaped memory structure 329. In other embodiments, a vertical, 3D memory structure 329 can comprise a "U" shaped structure or can have another vertical and/or stacked architecture. In certain embodiments, four sets of strings 329 (e.g., four sets of 48 word lines, or another predefined number of word lines) can form an erase block, while in other embodiments, fewer or more than four sets of strings 329 can form an erase block. As can be appreciated, any suitable number of storage cells can be part of a single string 329. In one embodiment, a single string 329 includes 48 storage cells.

Figure 4:
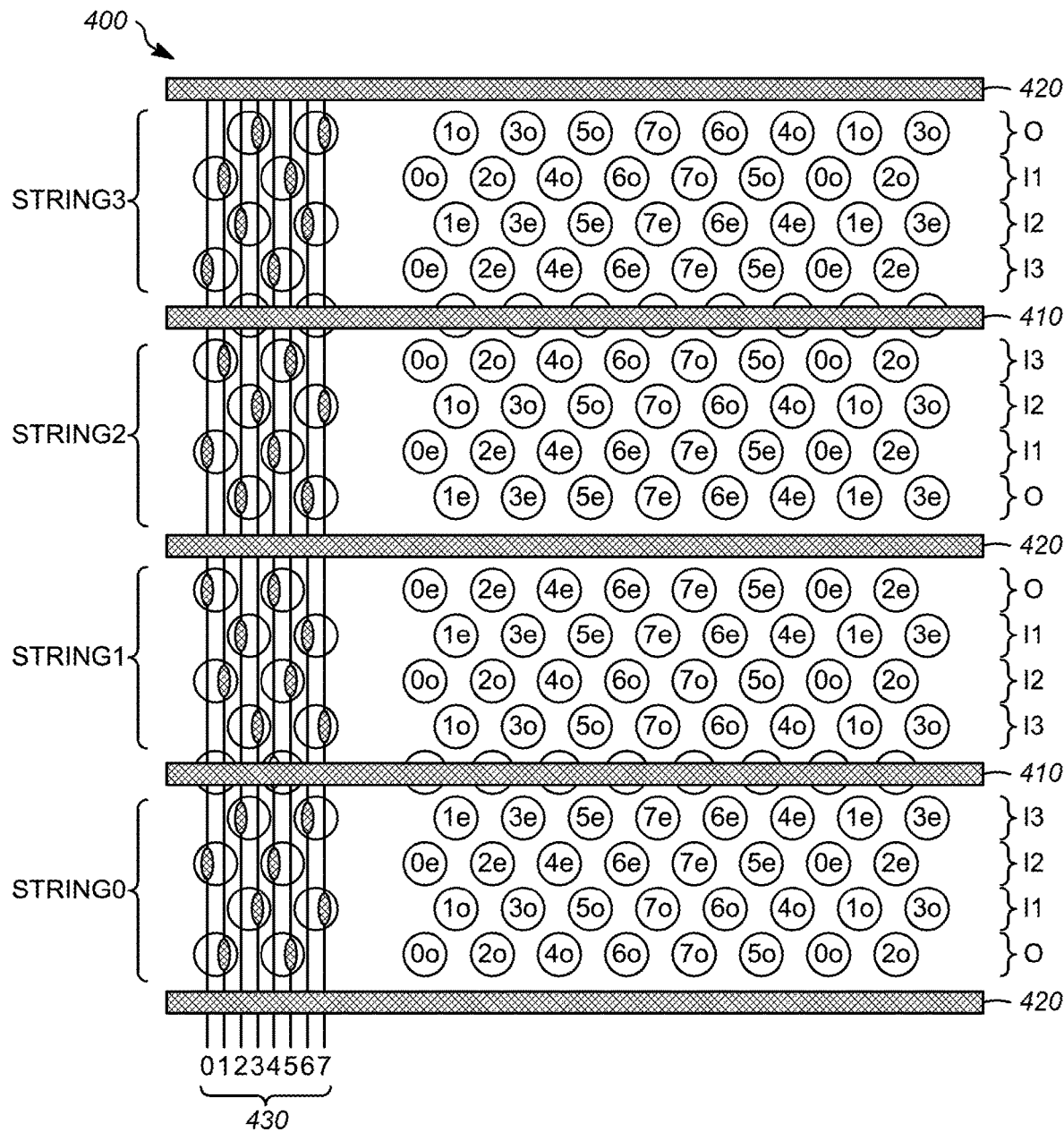
FIG. 4 illustrates a diagram showing a top view of a 3D memory block according to an example embodiment.

FIG. 4 is a diagram illustrating a top view of a 3D memory block 400, according to one embodiment. As illustrated, the 3D memory block 400 can comprise a series of memory holes or cells (represented by circles labeled "0o" to "7o" and "0e" to "7e" in FIG. 4). Each of these memory holes can be organized into strings (labeled as "String0" to "String3" in FIG. 4) and/or further organized into IO groups (labeled as "O," "I1," "I2," and "I3" in FIG. 4). Each IO group is located between two different types of etching features formed in the 3D memory block 400, a shallow etching feature 410 (e.g., called SHE), and a deep etching feature 420 (e.g., called ST). The IO groups adjacent to a deep etching feature 420 are labeled outer IO groups (O); the IO groups adjacent to a shallow etching feature 410 are labeled Inner3 IO groups (I3); the IO groups adjacent to the Outer IO groups are labeled Inner1 IO groups (I1); and the IO groups adjacent to the Inner3 IO groups (I3) are labeled Inner2 IO groups (I2). It should be noted that the procedures and methods disclosed herein can be implemented in connection with a wide variety of types of memory, such as NAND or NOR memory, 2D memory, 3D memory, or memory employing a charge-based or resistive-based storage technology. In one example, the illustrated memory block 400 can comprise 16K memory cells, which can be further segregated into smaller groups of memory cells comprising 1K memory cells each. These smaller groups can be arranged in tiers. The tiers can include the memory cells associated with the holes designated by the same designated circles in FIG. 4. The memory cells labeled as 2o are part of a same tier. The memory cells labeled 3e are part another tier. The memory cells labeled as 2e are part of a same tier. The memory cells labeled 3o are part another tier. As explained herein the controller can select a single tier for a program verify operation when the program verify level is unlikely to find an overprogrammed state or when the single tier is representative of the other tiers. At least one intermediate level for program verify is a multiple tier verify operation.

Some manufacturing processes for 3D memory can include film deposition processes that tend to dominate over etching processes performed during manufacturing. For these types of manufacturing processes, the outer memory holes in the Outer IO groups (O) will generally program slower than the inner memory hole (I3). However, other manufacturing processes for 3D memory can include etching processes that tend to dominate over film deposition processes during manufacturing. For these types of manufacturing processes, the inner memory hole (I3) will generally program slower than the outer memory holes (O). It should be noted, however, that the physical position of an IO group of memory cells within the 3D memory structure is not always dispositive of its relative programming speed due to this variation introduced during the manufacturing process or as a result of wear induced by usage of the device. Moreover, cycling degradation can also cause the relative programming speed of different memory cells, or groups of memory cells, to shift over time.

Continuing with FIG. 4, each of the memory holes (0o-7o and 0e-7e) can be connected to bit lines 430 (labeled as bit lines 0-7 in FIG. 4). The bit lines 430 extend above the memory holes and are connected to select memory holes via connection points (illustrated as small, solid ovals in FIG. 4) indicating where a bit line 430 connects to a memory hole. For ease of illustration, only eight bit lines 430 (0 to 7) are shown in FIG. 4. However, it will be understood that other bit lines (not shown) also extend above the other memory holes in FIG. 4.

Figure 5:
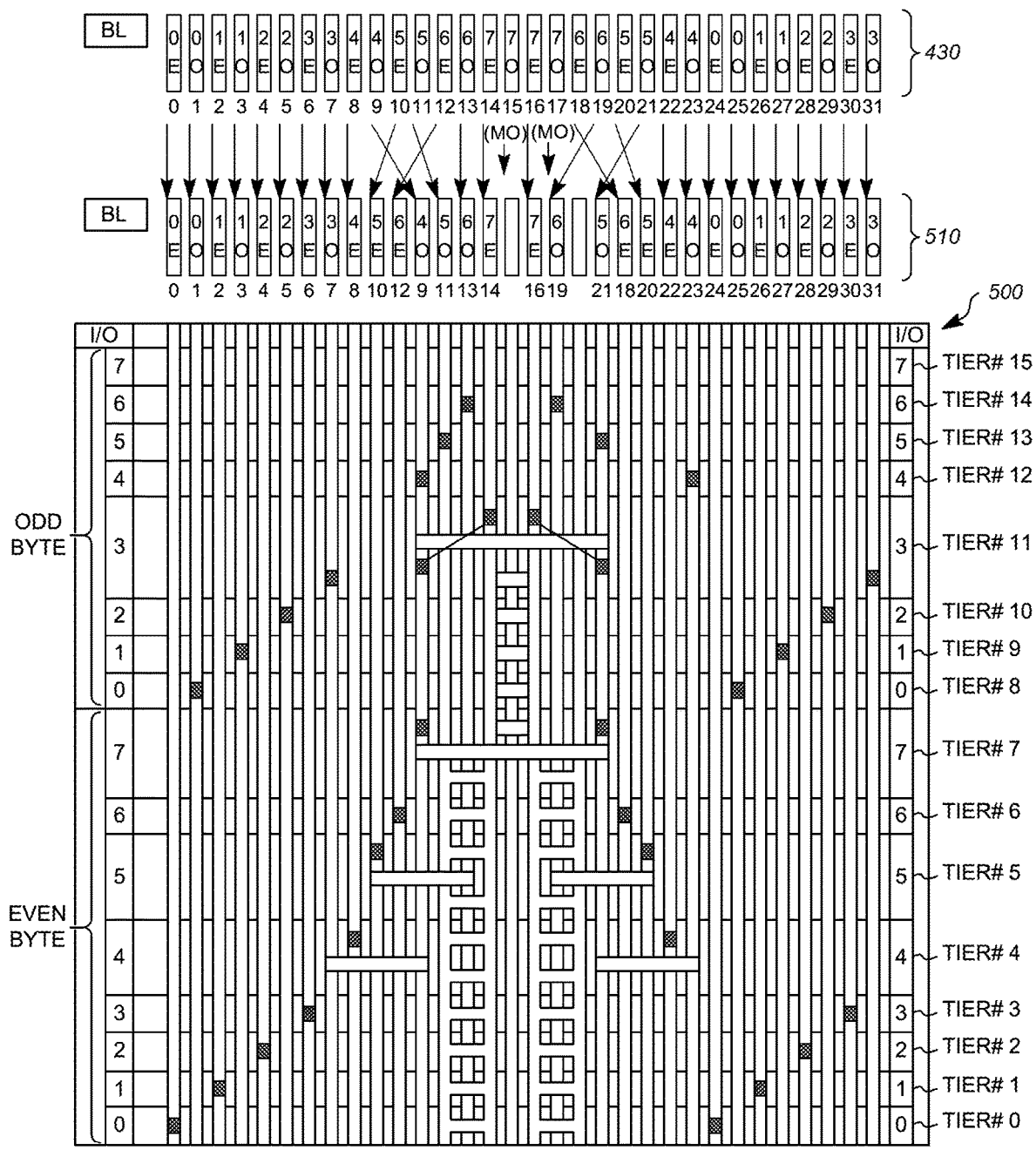
FIG. 5 illustrates an array of sense amplifier groups according to an exemplary embodiment for the 3D memory block of FIG. 4.

FIG. 5 illustrates an array of sense amplifier groups 500 for the 3D memory structure 400 of FIG. 4, according to one example. The bit lines 430 shown in FIG. 4 extend to the array of sense amplifier groups 500, as can be seen in FIG. 5. In this manner, certain memory holes of the 3D memory structure 400 can be electrically coupled to one of the bit lines 430, and each bit line can then be electrically coupled to a bit line interface 510. In an embodiment, the bit line interface 510 can additionally use scrambling, as illustrated by the angled/non-vertical lines shown in FIG. 5 between the bit lines 430 and the bit line interface 510. Thereafter, each bit line 430 can be electrically coupled to a sense amplifier group (labeled as Tier #0 to Tier #15 in FIG. 5). As illustrated in FIG. 5, each sense amplifier group extends horizontally across the page. Accordingly, each "tier" comprises a group of memory holes in electrical communication with a particular sense amplifier group via a bit line 430. A tier can also be referred to as a "subgroup of memory cells," or just a "subgroup." A "subgroup" of memory cells can be any subset of memory cells formed from a larger group of memory cells. In this application, a subgroup of memory cells can be referred to as a tier, a tier group, an IO group, a division, and the like.

Figure 6:
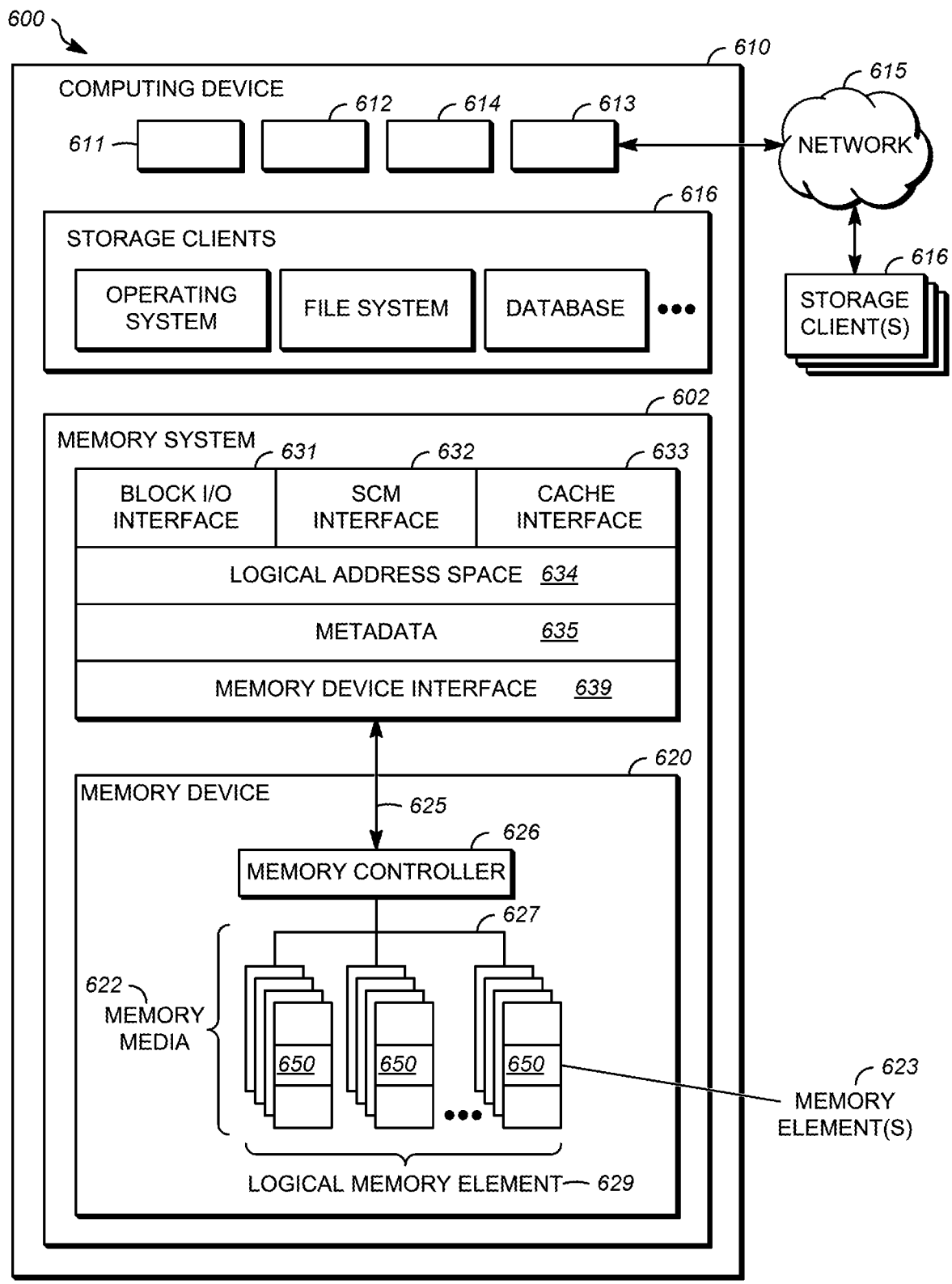
FIG. 6 illustrates a schematic block diagram illustrating an embodiment of a memory system according to an example embodiment.

FIG. 6 is a schematic block diagram illustrating an embodiment of a system 600 and device 610 for memory cell subgroup identification and selection. The computing device 610 comprises one or more identification circuits or tier selection circuits 650 for memory media 622 of a non-volatile and/or volatile memory device 620. As used herein, an "tier circuit" refers to a circuit utilized to identify a particular tier of memory cells (e.g., a 2o tier memory cells) in relation to at least one other subgroup or tier of memory cells and select the identified tier of memory cells for use in at least one programming operation, e.g., program verify. The tier selection circuits can operate to select a single tier for some program verify levels and multiple tiers for other program verify levels in a same verify operation. At least one verify is a single tier verify, e.g., the A or first program verify level. The first program verify level can be the lowest voltage. In an example embodiment, the last program verify level is also a single tier verify operation. In an example embodiment, at least one intermediate program verify is performed on multiple tiers.

A tier selection circuit 650 can be part of a non-volatile and/or volatile memory element 623 (e.g., disposed on a same integrated circuit device as a non-volatile memory media 622). In some embodiments, a memory device 620 can at least partially operate on and/or in communication with a nonvolatile and/or volatile memory system 602 of a computing device 610, which can comprise a processor 611, volatile memory 612, and a communication interface 613. The processor 611 can comprise one or more central processing units, one or more general-purpose processors, one or more application-specific processors, one or more virtual processors (e.g., the computing device 610 can be a virtual machine operating within a host), one or more processor cores, or the like. The communication interface 613 can comprise one or more network interfaces configured to communicatively couple the computing device 610 and/or memory controller 626 to a communication network 615, such as an Internet Protocol (IP) network, a Storage Area Network (SAN), wireless network, wired network, or the like.

The memory device 620, in various embodiments, can be disposed in one or more different locations relative to the computing device 610. In one embodiment, the memory device 620 comprises one or more non-volatile and/or volatile memory elements 623, such as semiconductor chips or packages or other integrated circuit devices disposed on one or more printed circuit boards, storage housings, and/or other mechanical and/or electrical support structures. For example, the memory device 620 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 620 can be integrated with and/or mounted on a motherboard of the computing device 610, installed in a port and/or slot of the computing device 610, installed on a different computing device 610 and/or a dedicated storage appliance on the network 615, in communication with the computing device 610 over an external bus (e.g., an external hard drive), or the like.

The memory device 620, in one embodiment, can be disposed on a memory bus of a processor 611 (e.g., on the same memory bus as the volatile memory 612, on a different memory bus from the volatile memory 612, in place of the volatile memory 612, or the like). In a further embodiment, the memory device 620 can be disposed on a peripheral bus of the computing device 610, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 620 can be disposed on a data network 615, such as an Ethernet network, an Infiniband network, SCSI RDMA over a network 615, a storage area network (SAN), a local area network (LAN), a wide area network (WAN) such as the Internet, another wired and/or wireless network 615, or the like.

The computing device 610 can further comprise a non-transitory, computer readable storage medium 614. The computer readable storage medium 614 can comprise executable instructions configured to cause the computing device 610 (e.g., processor 611) to perform steps of one or more of the methods disclosed herein. In one embodiment, a subgroup selection circuit 650 can comprise hardware of a non-volatile and/or volatile memory element 623, computer executable program code of a device driver, firmware of a memory controller 626 and/or a memory media controller for a memory element 623, another electrical component, or the like. In one embodiment, a subgroup selection circuit 650 is integrated on a memory element 623 (e.g., an on-die subgroup selection circuit 650 and/or other integrated hardware).

According to various embodiments, a memory controller 626 can manage one or more memory devices 620 and/or memory elements 623, one or more of which can comprise an on-die subgroup selection circuit 650. The memory device(s) 620 can comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 620). Memory units and/or regions can include, but are not limited to: pages, memory divisions, blocks, sectors, collections or sets of physical storage locations (e.g., logical pages, logical blocks), or the like.

A device driver and/or the memory controller 626, in certain embodiments, can present a logical address space 634 to the storage clients 616. As used herein, a logical address space 634 refers to a logical representation of memory resources. The logical address space 634 can comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an I node, a Universally Unique Identifier (UUID), a Globally Unique Identifier (GUID), a hash code, a signature, an index entry, a range, an extent, or the like.

A device driver for the memory device 620 can maintain metadata 635, such as a logical to physical address mapping structure to map logical addresses of the logical address space 634 to media storage locations on the memory device(s) 620. A device driver can be configured to provide storage services to one or more storage clients 616. The storage clients 616 can include local storage clients 616 operating on the computing device 610 and/or remote storage clients 616 accessible via the network 615 and/or network interface 613. The storage clients 616 can include, but are not limited to: operating systems, file systems, database applications, server applications, kernel-level processes, user-level processes, applications, and the like.

A device driver can be communicatively coupled to one or more memory devices 620. The one or more memory devices 620 can include different types of memory devices including, but not limited to: solid-state storage devices, semiconductor storage devices, SAN storage resources, volatile memory devices, non-volatile memory devices, or the like. The one or more memory devices 620 can comprise one or more respective memory media controllers 626 and memory media 622. A device driver can provide access to the one or more memory devices 620 via a traditional block I/O interface 631. Additionally, a device driver can provide access to enhanced functionality through the SCM interface 632. The metadata 635 can be used to manage and/or track data operations performed through any of the Block I/O interface 631, SCM interface 632, cache interface 633, or other related interfaces.

The cache interface 633 can expose cache-specific features accessible via a device driver for the memory device 620. Also, in some embodiments, the SCM interface 632 presented to the storage clients 616 provides access to data transformations implemented by the one or more memory devices 620 and/or the one or more memory media controllers 626.

A device driver can present a logical address space 634 to the storage clients 616 through one or more interfaces. As discussed above, the logical address space 634 can comprise a plurality of logical addresses, each corresponding to respective media locations on one or more memory devices 620. A device driver can maintain metadata 635 comprising any-to-any mappings between logical addresses and media locations, or the like.

A device driver can further comprise and/or be in communication with a memory device interface 639 configured to transfer data, commands, and/or queries to the one or more memory devices 620 over a bus 625, which can include, but is not limited to: a memory bus of a processor 611, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 615, Infmiband, SCSI RDMA, or the like. The memory device interface 639 can communicate with the one or more memory devices 620 using input-output control (IO-CTL) command(s), IO-CTL command extension(s), remote direct memory access, or the like.

The communication interface 613 can comprise one or more network interfaces configured to communicatively couple the computing device 610 and/or the memory controller 626 to a network 615 and/or to one or more remote, network-accessible storage clients 616. The storage clients 616 can include local storage clients 616 operating on the computing device 610 and/or remote storage clients 616 accessible via the network 615 and/or the network interface 613. The memory controller 626 is part of and/or in communication with one or more memory devices 620. Although FIG. 6 depicts a single memory device 620, the disclosure is not limited in this regard and could be adapted to incorporate any number of memory devices 620, a combination of one or more volatile memory devices 620 and one or more non-volatile memory devices 620, or the like.

The memory device 620 can comprise one or more elements 623 of memory media 622. In one embodiment, an element 623 of memory media 622 comprises a volatile memory medium 622, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 623 of memory media 622 comprises a non-volatile memory medium 622, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 620 may rely, for example, on stored voltage levels or stored resistance levels. The one or more elements 623 of memory media 622, in certain embodiments, comprise storage class memory (SCM).

While legacy technologies such as NAND flash can be block and/or page addressable, storage class memory, in one embodiment, is byte addressable. In further embodiments, storage class memory can be faster and/or have a longer life (e.g., endurance) than NAND flash; can have a lower cost, use less power, and/or have a higher storage density than DRAM; or offer one or more other benefits or improvements when compared to other technologies. For example, storage class memory can comprise one or more non-volatile memory elements 623 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 622 is referred to herein as "memory media," in various embodiments, the non-volatile memory media 622 can more generally comprise one or more non-volatile recording media capable of recording data, which can be referred to as a non-volatile memory medium, a non-volatile storage medium, or the like. Further, the nonvolatile memory device 620, in various embodiments, can comprise a non-volatile recording device, a non-volatile memory device, a non-volatile storage device, or the like. Similarly, a nonvolatile memory element 623, in various embodiments, can comprise a non-volatile recording element, a non-volatile memory element, a non-volatile storage element, or the like.

The non-volatile memory media 622 can comprise one or more non-volatile memory elements 623, which can include, but are not limited to: chips, packages, planes, die, or the like. A non-volatile memory controller 626 can be configured to manage data operations on the nonvolatile memory media 622, and can comprise one or more processors, programmable processors (e.g., FPGAs), ASICs, microcontrollers, or the like. In some embodiments, the nonvolatile memory controller 626 is configured to store data on and/or read data from the nonvolatile memory media 622, to transfer data to/from the non-volatile memory device 620, and so on.

The non-volatile memory controller 626 can be communicatively coupled to the non-volatile memory media 622 by way of a bus 627. The bus 627 can comprise an I/O bus for communicating data to/from the non-volatile memory elements 623. The bus 627 can further comprise a control bus for communicating addressing, and other command and control information to the non-volatile memory elements 623. In some embodiments, the bus 627 can communicatively couple the non-volatile memory elements 623 to the non-volatile memory controller 626 in parallel. This parallel access can allow the non-volatile memory elements 623 to be managed as a group, forming a logical memory element 629. The logical memory element can be partitioned into respective logical memory units (e.g., logical pages) and/or logical memory divisions (e.g., logical blocks). The logical memory units can be formed by logically combining physical memory units of each of the non-volatile memory elements.

The non-volatile memory controller 626 can comprise and/or be in communication with a device driver executing on the computing device 610. A device driver can provide storage services to the storage clients 616 via one or more interfaces 631, 632, and/or 633. In some embodiments, a device driver provides a block-device I/O interface 631 through which storage clients 616 perform block-level I/O operations. Alternatively, or in addition, a device driver can provide a storage class memory (SCM) interface 632, which can provide other storage services to the storage clients 616. In some embodiments, the SCM interface 632 can comprise extensions to the block device interface 631 (e.g., storage clients 616 can access the SCM interface 632 through extensions or additions to the block device interface 631). Alternatively, or in addition, the SCM interface 632 can be provided as a separate API, service, and/or library. A device driver can be further configured to provide a cache interface 633 for caching data using the non-volatile memory system 602. A device driver can further comprise a non-volatile memory device interface 639 that is configured to transfer data, commands, and/or queries to the non-volatile memory controller 626 over a bus 625, as described above.

Figure 7:
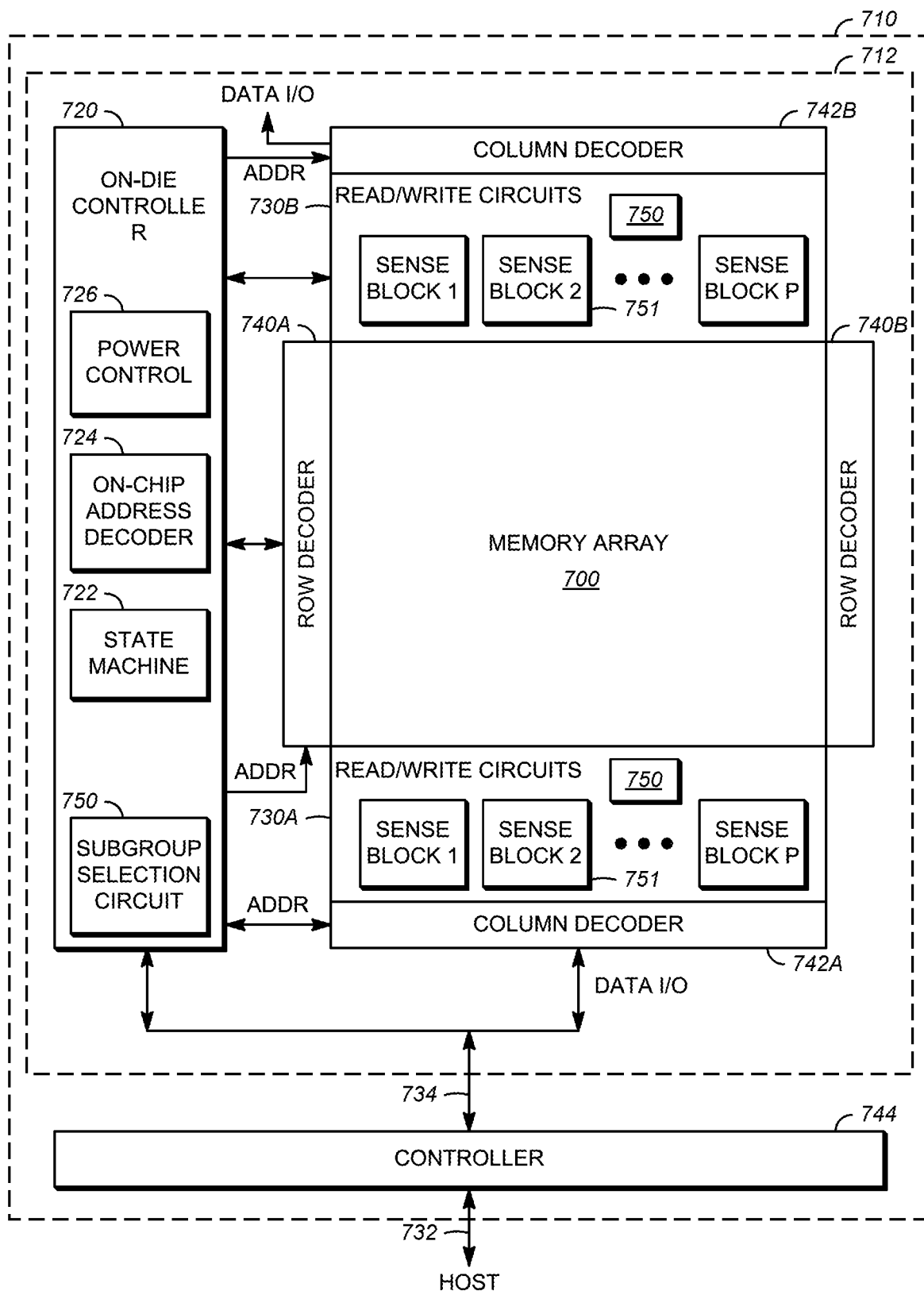
FIG. 7 illustrates a schematic block diagram of nonvolatile storage device for memory cell subgroup identification and selection.

FIG. 7 is a schematic block diagram illustrating an embodiment of a non-volatile storage device 710, which can perform programming and verify operations as described herein. The non-volatile storage device 710 can include one or more memory die or chips 712A "memory die" comprises a block of semiconducting material on which a memory circuit is fabricated and, as used herein, also includes the memory circuit disposed thereon. The nonvolatile storage device 710 can be substantially similar to the computing device 610 described with reference to FIG. 6.

The memory die 712, in some embodiments, includes an array 700 (e.g., two-dimensional or three dimensional) of memory cells, an on-die controller 720, and read/write circuits 730A/730B. In one embodiment, access to the memory array 700 by the various peripheral circuits is implemented in a symmetric fashion, on opposite sides of the memory array 700, so that the densities of access lines and circuitry on each side are reduced by half. The read/write circuits 730A/730B, in a further embodiment, include multiple sense blocks 751 which allow a page of memory cells to be read or programmed in parallel.

The memory array 700, in various embodiments, is addressable by word lines via row decoder circuits 740A/740B and by bit lines via column decoder circuits 742A/742B. In some embodiments, a controller 744 is included in the same memory device 710 (e.g., a removable storage card or package) as the one or more memory die 712. Commands and data are transferred between the host and controller 744 via lines 732 and between the controller and the one or more memory die 712 via lines 734. One implementation can include multiple chips 712.

On-die controller 720, in one embodiment, cooperates with the read/write circuits 730A/730B to perform memory operations on the memory array 700. The on-die controller 720, in certain embodiments, includes a state machine 722, an on-chip address decoder 724, and a power control circuit 726. In one embodiment, the on-chip address decoder 724 and/or the power control circuit 726 can be part of and/or controlled by the controller 744. The on-die controller c720 an operate to select certain single tiers for certain program verify levels and multiple tiers for other program verify levels.

The state machine 722, in one embodiment, provides chip-level control of memory operations. The on-chip address decoder 724 provides an address interface to convert between the address that is used by the host or a memory controller to the hardware address used by the decoder circuits 740A, 740B, 742A, 742B. The power control circuit 726 controls the power and voltages supplied to the word lines and bit lines during memory operations. In one embodiment, the power control circuit 726 includes one or more charge pumps that can create voltages larger than the supply voltage. The state machine can be used to count the bitscans and compare the result to the threshold value, which can be stored in the state machine. The state machine can also trigger the program verify operation to skip to the next memory level verify operation when the bitscan count exceeds the threshold value.

In an embodiment, one or any combination of the on-die controller 720, state machine 722, power control circuit 726, on-chip address decoder 724, decoder circuit 742 A, decoder circuit 742B, decoder circuit 740 A, decoder circuit 740B, read/write circuits 730 A, read/write circuits 730B, and/or controller 744 can be referred to as one or more managing circuits or generally as a controller circuitry.

Figure 8:
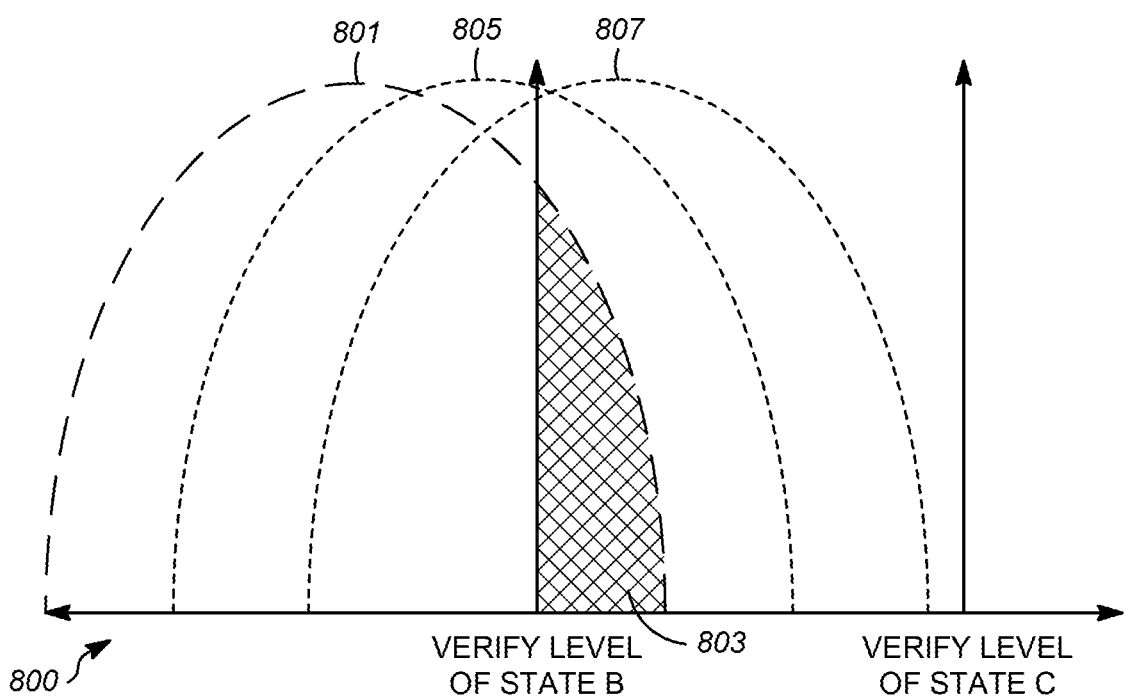
FIG. 8 illustrates a program verify operation according to an example embodiment.

FIG. 8 shows a diagram 800 with a threshold voltage (Vt) distribution during the middle of program operation and verifying a first memory state, here shown as the State B, and a second memory state, here state C. While the states B and C are used to illustrate the present concept, it will be recognized that the other consecutive states can also use similar principals. Voltage is represented on the abscissa.

In NAND memory, the logical value stored in a memory cell is determined by the voltage window in which the cell's Vt lies. The Vt is the voltage stored in a cell after the program pulse. As cell size is scaled down and more bits per cell are stored, the threshold voltage window used to represent each value becomes smaller, leading to increased error rates in determining a cell's value. This is because process variations become more prevalent when the amount of charge stored in a flash cell reduces with feature size, leading to the Vt of different cells storing the same value becoming significantly different. Hence, deciding what logical value to which a cell's threshold voltage corresponds is becoming increasingly difficult while it is necessary for reliability.

After respective program pulses are applied to the memory cells, the operation of the memory performs a verification step which can detect the distribution of the voltages stored in the memory cells. Each memory state (e.g., A-G states) has its own Vt, which increases with each successive state. The Vt distribution 801 results from a first program pulse being applied to the memory cells and shows the bitscan count of the number of memory cells as function of voltage. An upper tail of the distribution 801 includes some scanned bits (memory cells) that exceed the voltage verify level of State B. This is represented in area 803 to the right of the voltage verify level of State B. If the bitscan count in area 803 does not exceed a threshold value, then the memory system will apply the next program pulse, which will result in the distribution 805. If the bitscan count in area 803 meets or exceeds a threshold value, then the memory system will trigger the program verify pulse for C state, which results in bit scan distribution 805. No prior program verify have been applied for C state before triggering, which saves several program verify count and be known as smart skip program verify. This subsequent program pulse and verify will result in the distribution 807 beyond distribution 805 (at a higher voltage). In an example embodiment, when a Vt distribution at certain memory cell state, e.g., any of A through F states, then verify process can trigger the verify for next voltage level in the same verify process without triggering the next program pulse. In an example embodiment, the verify process counts bits to the right of the Vt of state B and triggers the verify for C state occurs in the same verify loop as the sensing of the bits that exceed the Vt of the B state.

During a program verify operation in the memory, an example embodiment typically performs a program verify of all states, e.g., A-G states, along a set scheme. See, e.g., FIG. 10A of U.S. Pat. No. 10,014,063, which is hereby incorporated by reference in its entirety. In some practical applications, performing verify of the C to G states after a first program pulse can be a waste of time and resources. Therefore, smart skip program verify detects when an upper tail of a lower state (e.g., A or B state) is above some threshold value and triggers the program verify for the next higher state prior to starting a next program/verify loop. This can reduce unnecessary program/verify loop for the higher state at subsequent program loop. In order to trigger the next state verify, there is a pre-defined bit count in the memory circuitry and during the program operation, when the bit scan result shows that upper tail has a higher bit count compared to a stored threshold value (or reaches the threshold value), the methodology triggers the next state verify after next program pulse.

The smart skip program verify operation detects the upper tail of "n" state and determines if triggering n+1 state verify based on the threshold value. The threshold value can be set based on statistical analysis of the memory device. If is desirable to determine when to skip to the next state (n+1) from the current state (n) being verified as even using the minimum voltage increase of the programing voltage, the earliest program verify initiates on the next loop (n+1 loop) instead of the current loop (n) can result in an over programming.

Figure 9A:
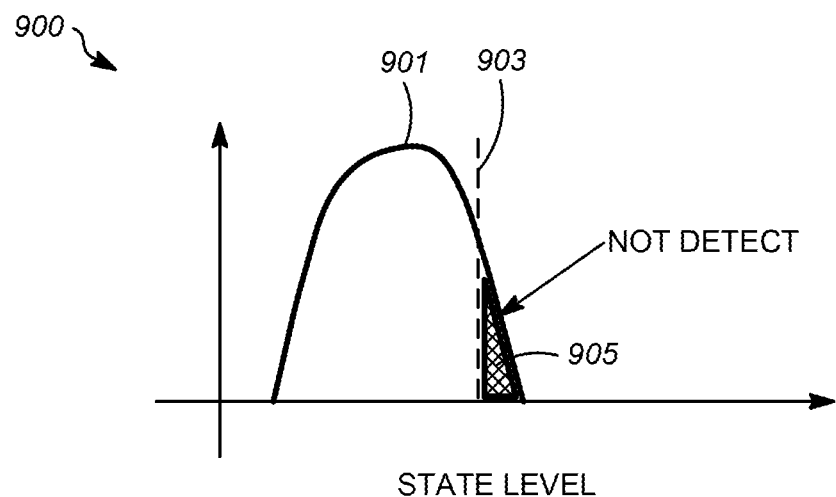
FIG. 9A illustrates a program verify operation that does not detect a bitcount above a threshold according to an example embodiment.

FIG. 9A shows a diagram 900 that includes a threshold voltage distribution 901, i.e., bitscan counts, from a verify operation. This is used to verify the programmed bit values stored in the addressed memory cells at the state verify level 903. The area 905 to the right of the voltage level and under the curve of the verify pulse 901 (its upper tail) is the count of bitscans (i.e., the count of memory cells whose voltage exceeds the state voltage level). The area 905 does not show enough count to exceed the threshold value to trigger a skip to the next state level in the same verify iteration.

Figure 9B:
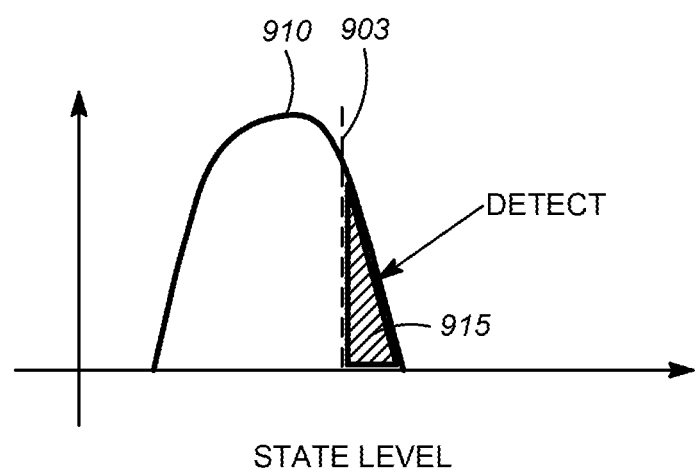
FIG. 9B illustrates a program verify operation that detect a bitcount above a threshold according to an example embodiment.

FIG. 9B shows a diagram that includes threshold voltage distribution 910, i.e., bitscan counts, from a verify operation. This is used to verify the programmed bit values stored in the addressed memory cells at the state level 903. The area 915 to the right of the voltage level and under the curve of the verify pulse 910 (e.g., the upper tail of distribution 910) is the count of bitscans (i.e., the number of memory cells whose voltage exceeds the state voltage level). The area 905 does show enough count to exceed the threshold value and trigger a program verify to the next state level in the same verify iteration. In an example embodiment, the methodology, will trigger a verify before applying the next program pulse.

Figure 10A:
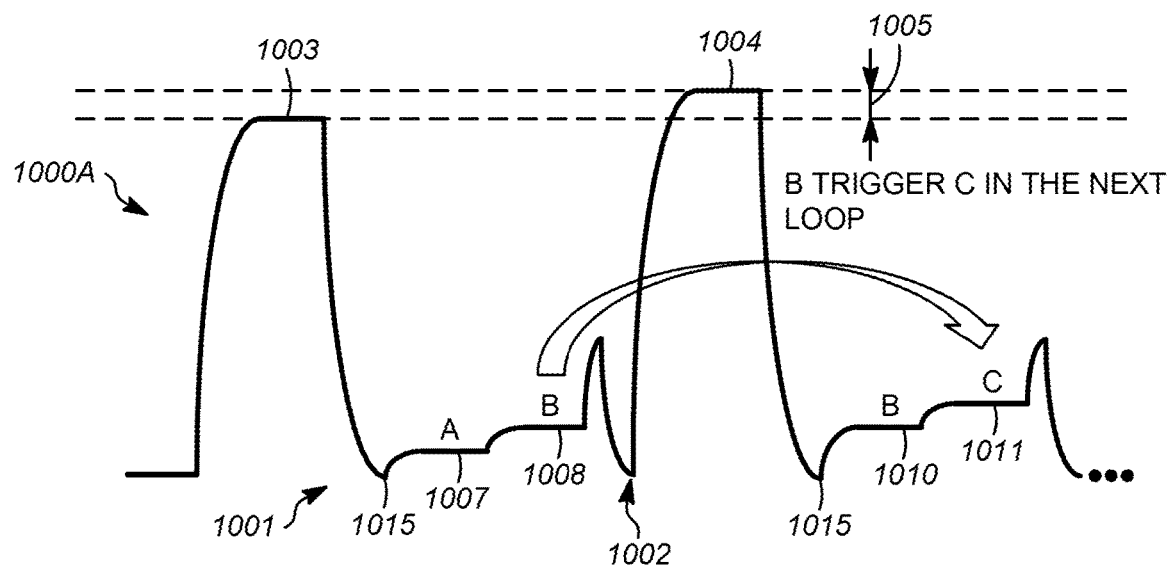
FIG. 10A illustrates a voltage levels in program verify iterations according to an example embodiment.

FIG. 10A shows a program verify operation 1000A with two program verify iterations. The operation 1000A is a partial example of a memory cell programming operation for a multi-state memory device having an erased state (Er) and three programmed memory states (e.g., A, B, C). The horizontal axis depicts time. The vertical axis depicts control gate or word line voltage. Generally, a programming operation can involve applying a pulse train to a selected word line, where the pulse train includes multiple program loops or program-verify iterations. The program portion of the program-verify iteration includes a Vpgm pulse (voltage pulses 1003 or 1004), and the verify portion of the program-verify iteration includes one or more verify pulses (e.g., voltage pulses 1007, 1008 or voltage pulses 1010, 1011).

For each Vpgm pulse 1003, 1004, a square waveform is depicted for simplicity, although other shapes are possible such as a multilevel shape or a ramped shape. Further, Incremental Step Pulse Programming (ISPP) is used in this example, in which the Vpgm pulse amplitude steps up in each successive program loop shown as the voltage increase 1005. This example uses ISPP in a single programming pass in which the programming is completed. ISPP also can be used in each programming pass of a multi-pass operation.

A pulse train typically includes Vpgm pulses which increase stepwise in amplitude by in each program-verify iteration using a fixed or varying step size, e.g., voltage step 1005. A new pulse train starts at an initial Vpgm pulse level (for e.g., for an A level) and ends at a final Vpgm pulse level (e.g., at a G level for a three bits multi-level memory) which does not exceed a maximum allowed level.

Operation 1000A includes a series of Vpgm pulses 1003, 1004 that are applied to a word line selected for programming, and an associated set of non-volatile memory cells. One, two or three verify voltage pulses are provided after each Vpgm pulse as an example, based on the target memory states which are being verified. A voltage of 0V (here shown at 1015) may be applied to the selected word line between the Vpgm pulses 1003, 1004 and verify voltage pulses 1007, 1008 and 1010, 1011.

In an embodiment, A-state verify voltage VvA (e.g., waveform or signal 1007) may be applied after the first Vpgm pulse 1003. The B-state verify voltage VvB (e.g., waveform or signal 1008) may be applied after the waveform 1007. The bitscan occurs to count the number of memory cells that exceed the B-state level. This is the operation shown and described with reference to FIG. 9B. As the bitscan count exceeds a threshold value, the memory controller triggers the operation 1000A in the next iteration 1002 to trigger the C-state level verify signal 1001.

The next iteration 1002 increases the Vpgm pulse 1004 by voltage 1005 from the first program pulse 1003. The signal level is dropped to about zero volts and then the B-state and C-state program verify pulses 1010, 1011 are applied. B-state verify voltage VvB (e.g., waveform or signal 1010) may be applied after the second Vpgm pulse 1003. The C-state verify voltage VvC (e.g., waveform or signal 1011) may be applied after the waveform 1010. Thus, the bitcount of the B-state triggered the verify of the C-state in a subsequent verify iteration.

Figure 10B:
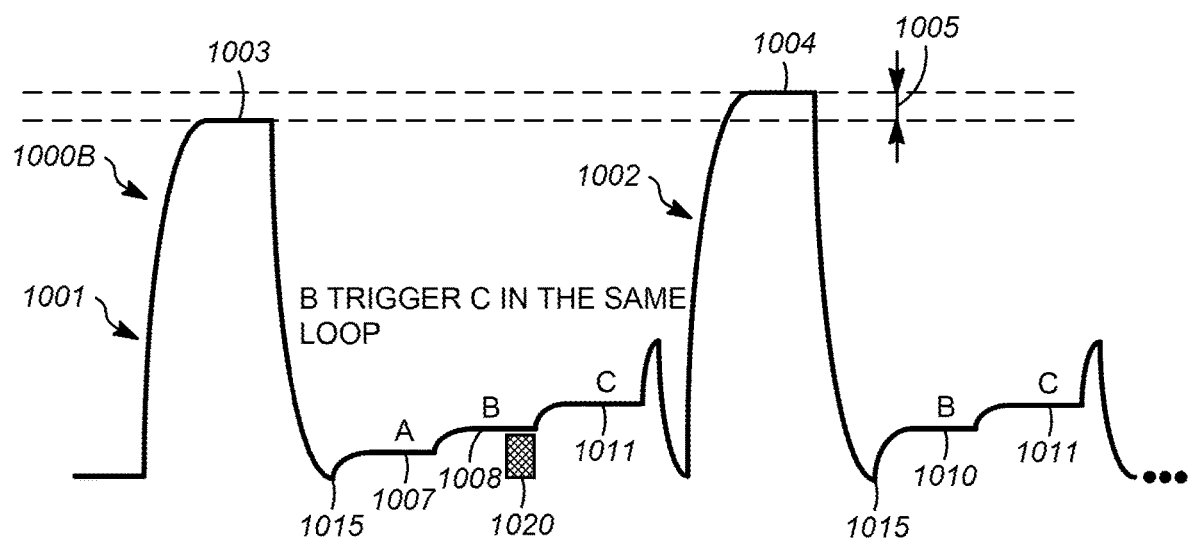
FIG. 10B illustrates a voltage levels in program verify iterations according to an example embodiment.

FIG. 10B shows a program operation 1000B, which is similar to operation 1000A with same signal, e.g., voltage levels, being designated with the same reference numbers as in FIG. 10A. However, there is a difference. When the bitcount from the bitscan occurring at the B-state, e.g., based on signal 1008, it triggers the operation 1000B to conduct the C-level verify in the same iteration. That is, the C-level verify is performed in the same iteration as the preceding B-state that exceeded the threshold value for the bitscan count. The initial C-level verify occurs before the incremented program signal 1004. This is schematically shown at box 1020 whereat the bitscan count of B-state occurs and the memory controller detects that the count threshold is met or exceeded. The memory controller then applies the next verify state level before proceeding to the iteration 1002.

While the above example uses the A-state, the B-state, and the C-state for illustrative purposes, it is within the scope of additional embodiments to apply the same determination of the bitscan count meeting or exceeding the count threshold to trigger the verification of the next state. For example, the C-state can trigger the D-state verify in the same iteration. The D-state bitscan count determination can trigger the E-state verify in the same iteration. The E-state bitscan count determination can trigger the F-state verify in the same iteration. The F-state bitscan count determination can trigger the G-state verify in the same iteration.

Figure 10C:
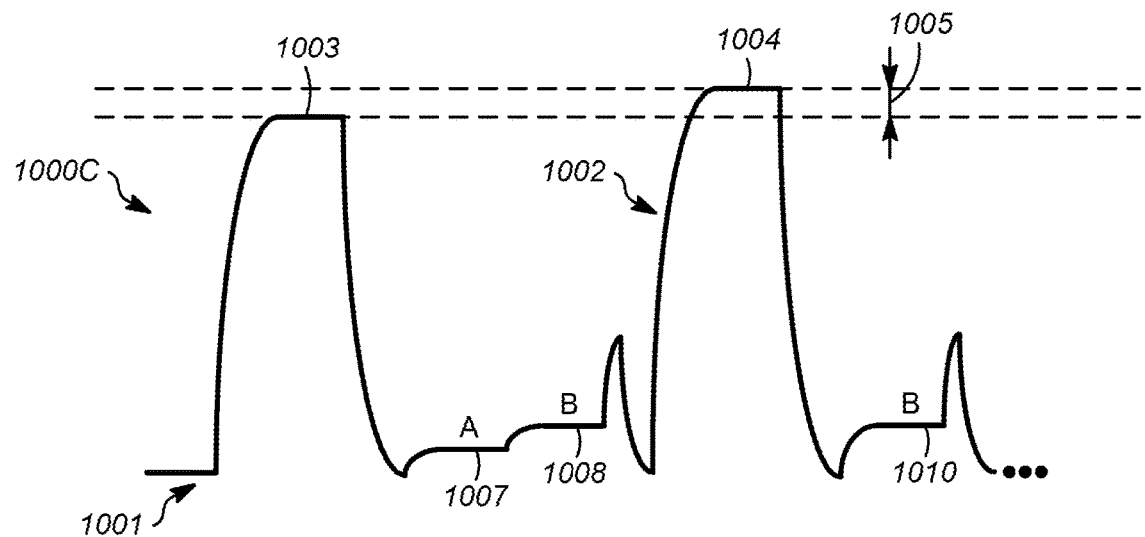
FIG. 10C illustrates a voltage levels in program verify iterations according to an example embodiment.

FIG. 10C shows a program and verify operation 1000C that is similar to FIGS. 9A and 9B, and the same elements are designated with the same reference numbers. However, this operation 1000C is when the bitscan count for the B-state does not exceed or meet the threshold value. This is the operation 1000C that results from the embodiment shown in FIG. 9A. The C-state is not triggered early by a count in the first iteration and thus is not in the second iteration 1002 or triggered in the first iteration 1001.

Figure 11A:
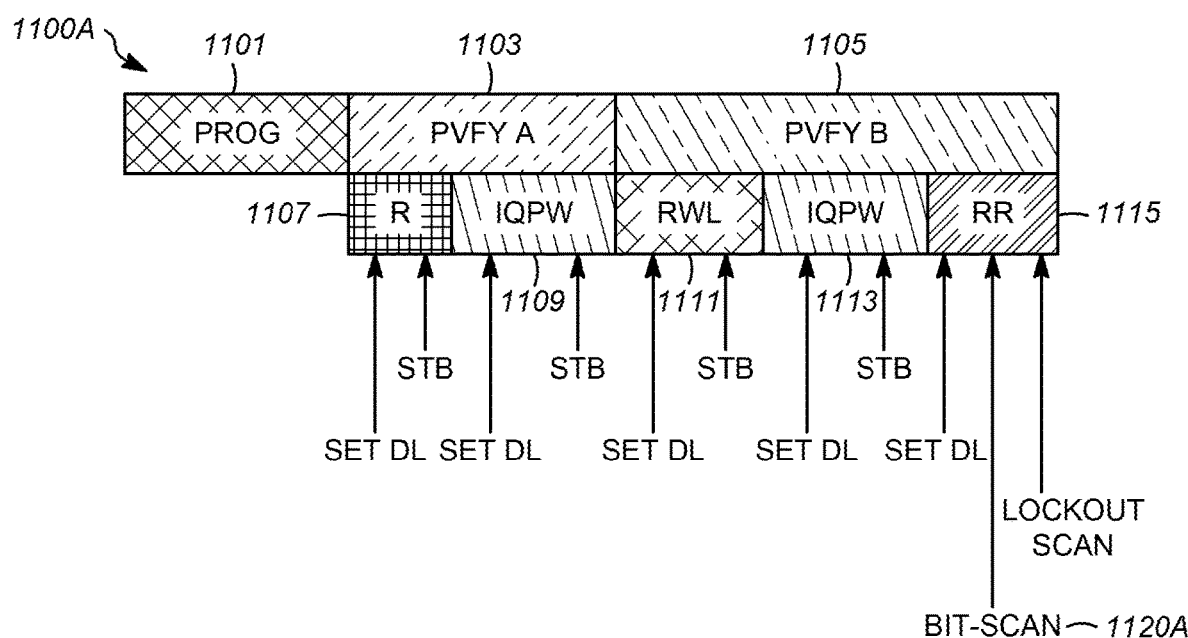
FIG. 11A illustrates the program and verify operation in a memory device according to an example embodiment.

FIG. 11A shows a schematic for a program verify iteration 1100A (loop) for two states, here A-state and B-state. The program operation 1101 starts the iteration. The program operation 1101 can start the program signal, e.g., signal 1003 in FIG. 3. The program operation 1101 applies the program pulse to the addressed memory cells. This can be after an erase pulse or after the data is stored in data latches. The program verify for A-state 1103 follows the program operation. The A-state program verify 1103 can be the same signals 1007 in FIG. 10A-10C. Two sub operations occur during verify 1103, the R time period 1107 and the IQPW 1109. The B-state program verify 1103 follows the A-state verify 1103 and can be the same signals 1008 in FIG. 10A-10C. Three sub operations occur during verify 1105, the RWL time period 1111, the IQPW 1113 and the RR operation 1115. Various strobes (STB) occur during these processes. Various data latch (DL) operations also occur. The bit-scan 1120 that provides the count to compare to the threshold occurs in time period associated with the RR 1115. If there are two verify operations after one program pulse, e.g., B state and C state. B state will have PVFY in the R clock and IQPW clock. C state will have PVFY in RWL clock and IQPW clock. B state's R clock uses VvB1 and IQPW uses VvB. C state's RWL clock uses VvC1 and IQPW clock uses VvC.

Here, strobe occurs in each clk. For example, VvB1 strobe occurs in R clk. After strobe, it needs to count (bitscan) the result of strobe and it happens in iQPW clk. VvB strobe happens in iQPW clk and will be count in RWL clk if next state verify exist or RR clk if next state verify do not exist. (The bitscan operation has a clk shift)

In use, each memory state (e.g., A-G states) has its own verify level, VvA (VH). IQPW uses this level. We have VvA1 (VL), which is smaller than VvA. The purpose of performing VvA1 bitscan is also to prevent over program issue since the verify voltage level is smaller, therefore, providing earlier detection. These happens during the program verify PVFY. Based on the result in PVFY, the present methodology can adjust VBLC in the P clk. Cells above VvA will have higher VBLC to have weaker program and cells above VvA1 will apply 0V VBLC for stronger program. The overall purpose is to make Vt distribution tighter.

In an example operation, the programming can be performed using quick pass write. In some embodiments, a quick pass write (QPW) or slow programming mode when a storage element is near its target threshold voltage level. For example, verify low levels such as Vval, VvbL, and VvcL may be used. In one embodiment, QPW is used for A-, B-, and C-states. In one embodiment, QPW is used for A- and B-states, but not for the C-state. For example, lower verify levels can be used when programming the A-, B- and C-states. For QPW, bit line voltage (VBLC) is biased to 0 volts. As the target memory cells approaches the threshold voltage (Vt), programming is slowed by applying a small bit line bias, e.g., 0.7 volts. This results in a Vt shift that is less than change in the programming voltage (dVpgm, the increment in the programming pulses). Instead of using VBLC for tighter Vt distribution of QPW, adjusting current sensing time to achieve tighter Vt distribution is named as IQPW, which further improve performance without voltage stabilization of VBLC.

In use, the A-state data latch (DL) can be the lower page of data stored in the memory. The B-state data latch (DL) can be the middle page of data. The C-state data latch (DL) can be the upper page of data. A/B/CDL: LP/MP/UP data. The sense data latch (SDL) determines inhibit bit line ramp up or stay at Vss. Transfer data latches can transfer data between the memory (NAND) and a controller. R & RWL are also known as $V_L$ and QPW is $V_H$. Currently, VL and VH are not differentiated by control gate voltage but sensing time. The strobe (STB) operation is fast and senses data into sense data latch (SDL, like a series combination of 1 and 0 among bit line columns. The set data latch can transfer sensed data latch values to A-state/B-state/C-state data latches. In the RR clock, it is also written as $V_H$ scan. The lockout scan is a process transfer from A/B/C data latches to sense data latches. The SPCV bit-scan can occur between $V_H$ scan and lockout scan.

Figure 11B:
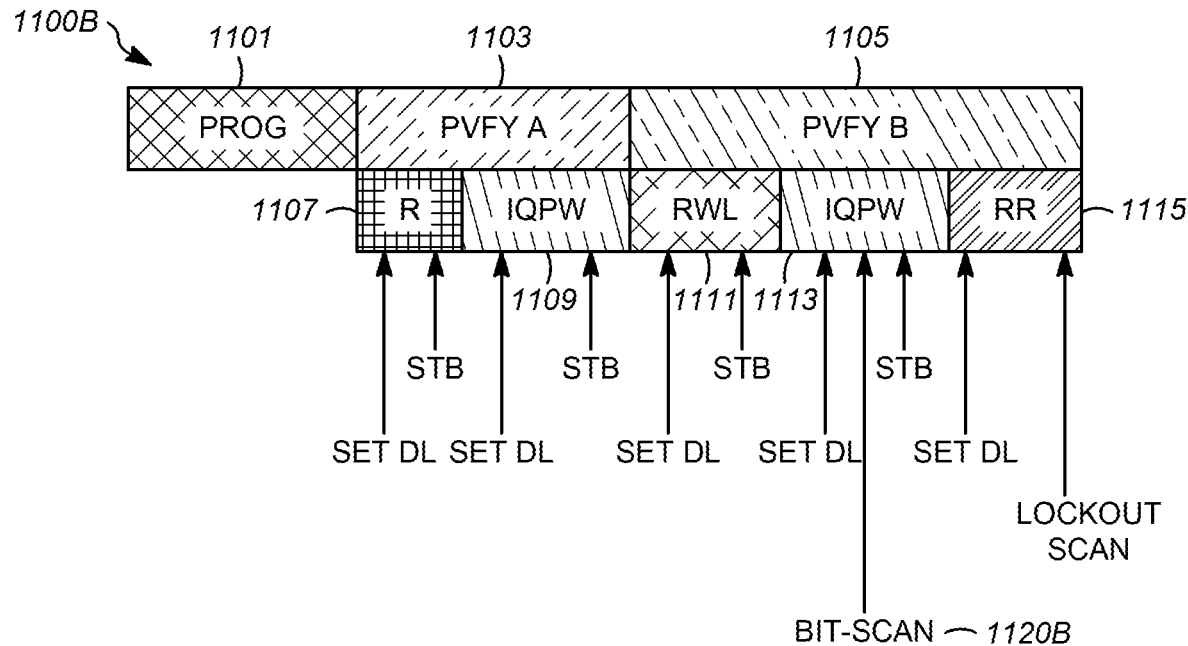
FIG. 11B illustrates the program and verify operation in a memory device according to an example embodiment.

FIG. 11B shows a schematic view of a program verify iteration 1100B, which is similar to the iteration 1100A and the same elements are designated with the same reference numbers. The difference is the bitscan 1120B is moved to the IQPW stage 1113 to allow the memory time to trigger the verify operation for the next state before the RR time 1115.

Figure 11C:
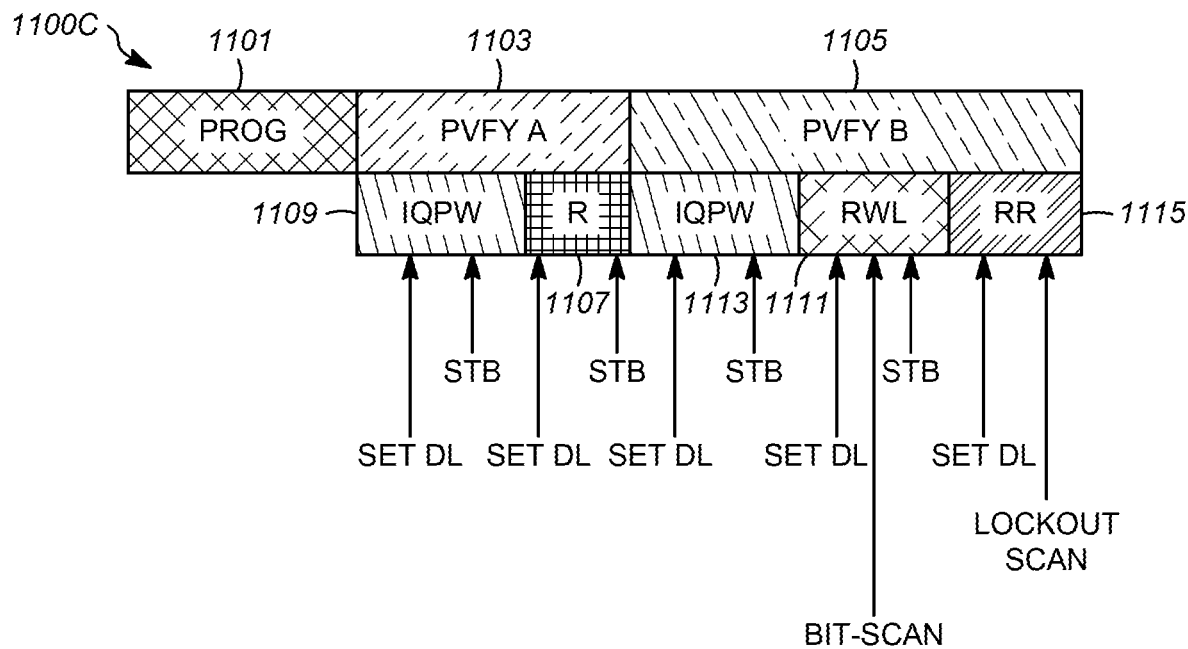
FIG. 11C illustrates the program and verify operation in a memory device according to an example embodiment.

FIG. 11C shows a program verify iteration 1100B, which is similar to the iteration 1100A and 1100B with the same elements being designated with the same reference numbers. A difference is that the IQPW stages 1109, 113 are performed before the R stage 1107 and the RWL stage, respectively. Another difference is the bitscan 1120C is moved to the IQPW stage 1111 to allow the memory time to trigger the verify operation for the next state before the RR time 1115.

Figure 12:
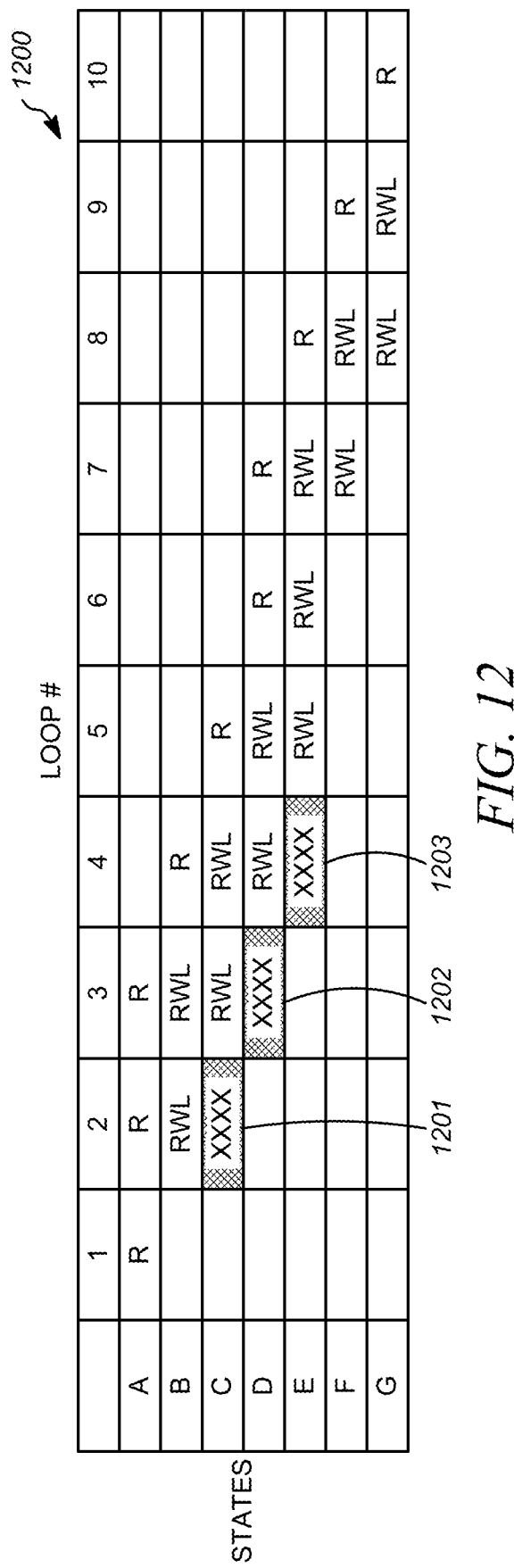
FIG. 12 illustrates states versus verify loop number.

FIG. 12 shows a program verify schematic diagram 1200 showing the memory states A-G and the programming/verify iterations (loops) 1-10. The iterations that are of interest in this example at the loops 2-4 during which the next memory state can be triggered in the loop. In loop 2, the system is verifying memory A-state and then B-state. This can be similar to that shown in FIGS. 10A and 10C. The verify operation of C-state in loop 2 at box 1201 is dependent on the bitcount that occurs in B-state. If the bitcount of B-state does not meet the threshold value, the process will move to loop 3. If the bitcount of B-state meets the threshold value, then the C-state verify is triggered in loop 2. Likewise in loop 3, the verify operation on the D-state in box 1202 is dependent on the bitcount that occurs in C-state. If the bitcount of C-state does not meet the threshold value, the process will move to loop 4. If the bitcount of C-state meets the threshold value, then the D-state verify is triggered in loop 3. In loop 4, the verify operation on the E-state in box 1203 is dependent on the bitcount that occurs in D-state. If the bitcount of D-state does not meet the threshold value, the process will move to loop 5. If the bitcount of D-state meets the threshold value, then the E-state verify is triggered in loop 4. Thus, the optional addition of the next state verify in a same loop is dependent on the bitcount in the last scheduled state in the loop.

Figure 13:
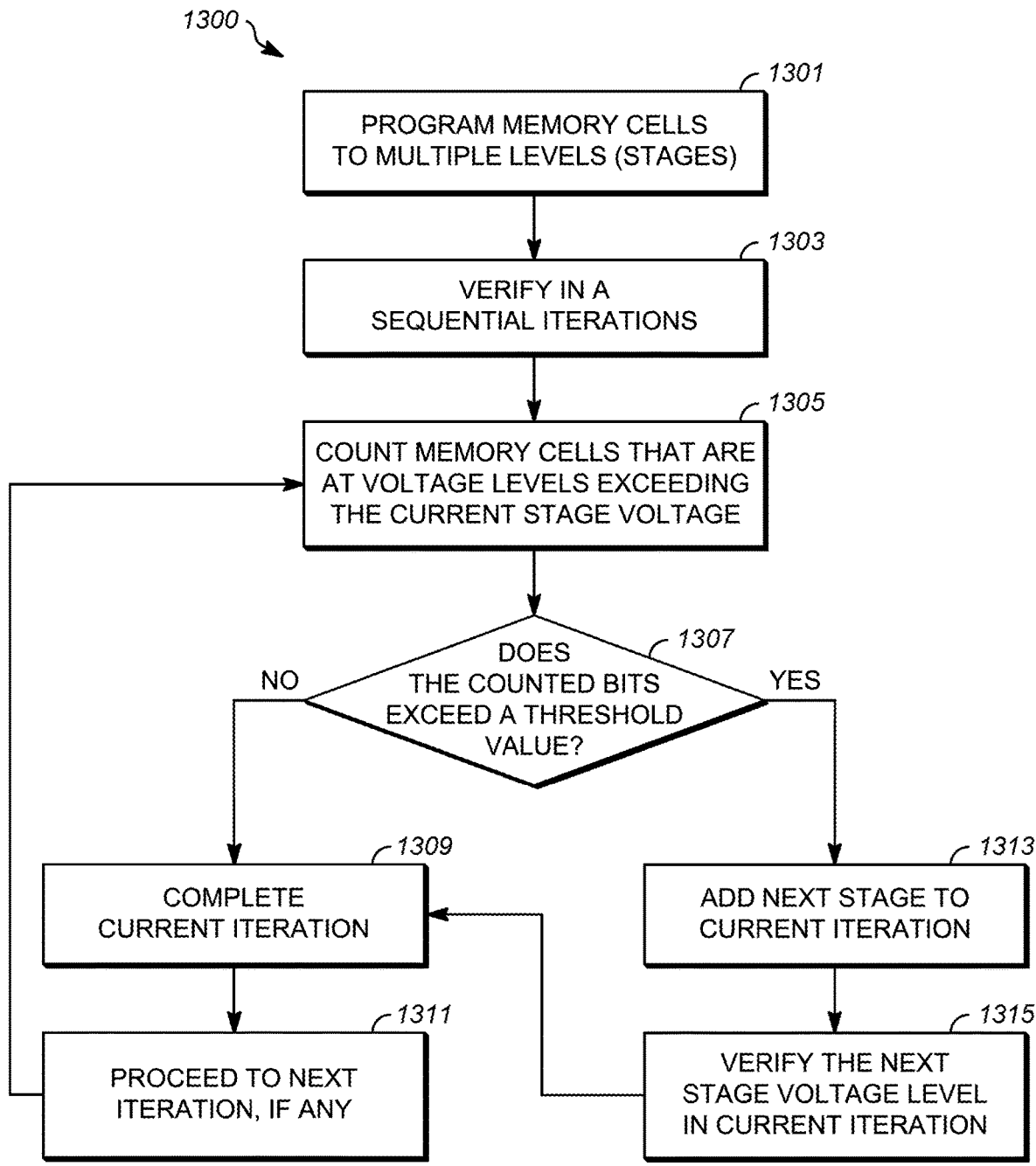
FIG. 13 illustrates a process flow according to an example embodiment.

FIG. 13 shows a process flow 1300 for a program verify operation according to an example embodiment. At 1301, the memory cells are programmed and each can contain one of multiple levels representing bits at the voltage levels of the particular stage. At 1303, a verify operation is performed in a sequential fashion using an increased program voltage. The increase is a change from the voltage of the preceding stage.

At 1305, a bit count is performed to count the bits that exceed the voltage of the stage being verified.

At 1307, it is determined if the counted bits from the bitcount exceed a threshold value. If no, the process moves to 1309. If yes, the process moves to 1313.

At 1309, the verify operation for the current stage is completed and the iteration is completed.

At 1311, the process proceeds to the next iteration and returns to step 1305 if the next iteration exists for verification. If the process completes the last iteration, the process ends.

At 1313, the next stage is added to the current iteration. The verify of the added stage is performed at 1315. Then the process moves to step 1309.

In at least some example embodiments described herein, if an over program occurs at a memory state, those over programmed states can be provided with a verify compared to a non-over programmed state. In at least some of the present embodiments, the next state verify is triggered and can account for the over program in that appears in the next program loop, which can be a cause of over programming. Embodiments of the present disclosure can also optimize program verify, e.g., using smart skip program verify functions, while minimizing the programming time penalty.

Modules can also be implemented at least partially in software for execution by various types of processors. An identified module of executable code can, for instance, comprise one or more physical or logical blocks of computer instructions which can, for instance, be organized as an object, procedure, or function. Nevertheless, the executables of an identified module need not be physically located together but can comprise disparate instructions stored in different locations which, when joined logically together, comprise the module and achieve the stated purpose for the module.

Indeed, a module of executable code can include a single instruction, or many instructions, and can even be distributed over several different code segments, among different programs, across several memory devices, or the like. Where a module or portions of a module are implemented in software, the software portions can be stored on one or more computer readable and/or executable storage media. Any combination of one or more computer readable storage media can be utilized. A computer readable storage medium can include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium can be any tangible and/or non-transitory medium that can contain or store a program for use by or in connection with an instruction execution system, apparatus, processor, or device.

Computer program code for carrying out operations for aspects of the present disclosure can be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code can execute partly or entirely on one or more of a user's computer and/or on a remote computer or server over a data network or the like. A component, as used herein, comprises a tangible, physical, non-transitory device. For example, a component can be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component can also be implemented in programmable hardware devices such as field programmable gate arrays, programmable array logic, programmable logic devices, or the like. A component can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can alternatively be embodied by or implemented as a component.

A circuit or circuitry, as used herein, comprises a set of one or more electrical and/or electronic components providing one or more pathways for electrical current. In certain embodiments, a circuit can include a return pathway for electrical current, so that the circuit is a closed loop. In another embodiment, however, a set of components that does not include a return pathway for electrical current can be referred to as a circuit (e.g., an open loop). For example, an integrated circuit can be referred to as a circuit regardless of whether the integrated circuit is coupled to ground (as a return pathway for electrical current) or not. In various embodiments, a circuit can include a portion of an integrated circuit, an integrated circuit, a set of integrated circuits, a set of non-integrated electrical and/or electrical components with or without integrated circuit devices, or the like. In an embodiment, a circuit can include custom VLSI circuits, gate arrays, logic circuits, or other integrated circuits; off-the-shelf semiconductors such as logic chips, transistors, or other discrete devices; and/or other mechanical or electrical devices. A circuit can also be implemented as a synthesized circuit in a programmable hardware device such as field programmable gate array, programmable array logic, programmable logic device, or the like (e.g., as firmware, a netlist, or the like). A circuit can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can be embodied by or implemented as a circuit.

By way of introduction, the following brief definitions are provided for various terms used in this application. Additional definitions will be provided in the context of the discussion of the figures herein. As used herein, "exemplary" can indicate an example, an implementation, and/or an aspect, and should not be construed as limiting or as indicating a preference or a preferred implementation. Further, it is to be appreciated that certain ordinal terms (e.g., "first" or "second") can be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") can indicate "one or more" rather than "one." As used herein, a structure or operation that "comprises" or "includes" an element can include one or more other elements not explicitly recited. Thus, the terms "including," "comprising," "having," and variations thereof signify "including but not limited to" unless expressly specified otherwise. The terms "a," "an," and "the" also refer to "one or more" unless expressly specified otherwise. Further, an operation performed "based on" a condition or event can also be performed based on one or more other conditions or events not explicitly recited. As used in this application, the terms "an embodiment," "one embodiment," "another embodiment," or analogous language do not refer to a single variation of the disclosed subject matter; instead, this language refers to variations of the disclosed subject matter that can be applied and used with a number of different implementations of the disclosed subject matter. An enumerated listing of items does not imply that any or all of the items are mutually exclusive and/or mutually inclusive, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions can be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. Other steps and methods can be conceived that are equivalent in function, logic, or effect to one or more blocks, or portions thereof, of the illustrated figures. Although various arrow types and line types can be employed in the flowchart and/or block diagrams, they are understood not to limit the scope of the corresponding embodiments. For instance, an arrow can indicate a waiting or monitoring period of unspecified duration between enumerated steps of the depicted embodiment.

As used herein, a "memory cell" comprises a hardware component that may store a single state. The memory cell may comprise a volatile or a non-volatile memory cell. The state stored in memory cell may represent one of various types of values, such as a single-bit value or a multi-bit value In the preceding detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure can refer to elements of proceeding figures. Like numbers can refer to like elements in the figures, including alternate embodiments of like elements.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
    a plurality of memory cells configured to store multiple states;
    a memory controller configured to perform a plurality of program-verify iterations, in the program-verify iterations, the controller being configured to:
    program the plurality of memory cells at any of the multiple states to store data therein;
    verify stored data values programmed into the plurality of memory cells sequentially in stages:
    count passed bits that exceed a stage voltage value for a stage being verified to produce a passed bit count number;
    determine if the passed bit count number for the stage being verified meets a threshold value;
    if the passed bit count number is greater than zero but does not meet the threshold, continue the program-verify iteration without verifying a next stage and thereafter move to a next verify program-verify iteration; and
    if the passed bit count number does meet the threshold, add verifying a next stage to the program-verify iteration and thereafter move to a next program-verify iteration.

2. The apparatus of claim 1, wherein the states of the memory include eight states with sequentially increasing programming voltages.

3. The apparatus of claim 2, wherein each stage has a stage voltage value and the stage voltage values of the stages sequentially increase for successive stages.

4. The apparatus of claim 3, wherein the memory controller is configured to count memory cells that exceed the stage voltage value for a stage being verified.

5. The apparatus of claim 4, wherein the memory controller is configured to issue a first program pulse followed by an A-stage verify and a B-stage verify, count passed bits in the B-stage verify, and output a C-stage verify signal during a same program-verify iteration as both the A-stage verify and the B-stage verify when the passed bit count number exceeds the threshold, and wherein the memory controller is configured to issue a second program pulse, greater than the first program pulse and performing an additional B-stage verify and an additional C-stage verify.

6. The apparatus of claim 5, wherein the memory controller is configured to count passed bits of a C-stage verify and output a D-stage verify signal during the same program-verify iteration as both the additional B-stage verify and the additional C-stage verify when a C-stage passed bit count number exceeds the threshold, and wherein the memory controller is configured to issue a third program pulse, greater than the second program pulse, and the issuing instructions for the additional C-stage verify and an additional D-stage verify.

7. The apparatus of claim 6, wherein the memory controller is configured to count passed bits of the additional D-stage verify and output an E-stage verify signal during the same iteration as both the additional C-stage verify and the additional D-stage verify when the D-stage passed bit count number exceeds the threshold, and wherein the memory controller is configured to issue a fourth program pulse, greater than the third program pulse and the issuing instructions for still another D-stage verify and an additional E-stage verify.

8. The apparatus of claim 7, wherein the memory controller is configured to not add an F-stage verify or a G-stage verify to a preceding iteration.

9. The apparatus of claim 8, wherein the memory controller is configured to perform IQPW before either a low program verify clock or a high program verify clock with the bit count occurring during a RWL clock.

10. The apparatus of claim 1, wherein the memory cells are multiple level memory cells storing greater than one bit in binary.

11. A nonvolatile memory control method, comprising:
programming memory cells;
verifying stored values programmed into the cells including:
counting passed bits that exceed a voltage value for a stage being verified to produce a passed bit count number;
determining if the passed bit count number for the stage being verified meets a threshold value;
if the passed bit count number is greater than zero but does not meet the threshold value, continuing with a current program-verify iteration without verifying a next stage and thereafter move to a next program-verify iteration;
if the passed bit count number does meet the threshold value, adding verifying a next stage to the current program-verify iteration and thereafter move to a next verify program-iteration.

12. The method of claim 11, wherein verifying includes conducting next stage verify after a subsequent programming pulse that has an increased voltage from a preceding programming pulse.

13. The method of claim 12, wherein counting bits includes conducting a bit scan during a high state verify phase of the verifying.

14. The method of claim 13, wherein conducting the bit scan during the high state phase of the verifying includes performing the high state verify phase after an IQPW phase.

15. The method of claim 11, wherein adding the next stage to the current verify iteration and thereafter move to a next verify iteration includes increasing a verify signal to the next stage value directly from a preceding verify voltage and not applying a programming pulse or dropping the preceding verify voltage to about zero volts.

16. The method of claim 11, wherein programming the memory cells includes programming seven stages (A-G) and wherein verifying includes only adding the next stage when the next stage is the C-stage, the D-stage or the E-stage.

17. The method of claim 16, wherein verifying includes issuing a first program pulse followed by an A-stage verify signal and a B-stage verify signal, counting passed bits in a B-stage verify, and outputting a C-stage verify signal during the same iteration as both the A-stage verify and the B-stage verify when a passed bit count number of the B-stage exceeds the threshold, and moving to a subsequent iteration when the passed bit count number of the B-stage does not meet the threshold during which issuing a second program pulse, greater than the first program pulse and performing an additional B-stage verify and an additional C-stage verify.

18. A circuit for operating a plurality of memory dies, comprising:
a bus configured to connect with a plurality of nonvolatile memory cells;
the circuit being further configured to:
via the bus, program the nonvolatile memory cells;
via the bus, verify stored bits programmed into the memory cells with variable verify steps values in a same verify iteration, including:
counting stored bits that exceed a voltage value for a stage being verified to produce a passed bit count number,
determining if the passed bit count number for the stage being verified meets a threshold value,
if the passed bit count number is greater than zero but does not meet the threshold value, continue with a current program-verify iteration without verifying a next stage and thereafter move to a next program-verify iteration, and
if the passed bit count number does meet the threshold value, add verifying a next stage to the current program-verify iteration and thereafter move to a next program-verify iteration.

19. The circuit as set forth in claim 18, wherein the states of the memory include eight states with sequentially increasing programming voltages.

20. The circuit as set forth in claim 19, wherein each stage has a stage voltage value and the stage voltage values of the stages sequentially increase for successive stages.

* * * * *